(12) United States Patent
Bhardwaj et al.

(10) Patent No.: US 12,393,895 B2
(45) Date of Patent: Aug. 19, 2025

(54) HYDRAULIC FRACTURING OPERATION PLANNING USING DATA-DRIVEN MULTI-VARIATE STATISTICAL MACHINE LEARNING MODELING

(71) Applicant: Halliburton Energy Services, Inc., Houston, TX (US)

(72) Inventors: Manisha Bhardwaj, Houston, TX (US); Dwight David Fulton, Cypress, TX (US); Harold Grayson Walters, Tomball, TX (US); Ajish Sreeni Radhakrishnan Potty, Missouri City, TX (US); Vikesh Singh Baghel, Pune (IN); Richa Chauhan, Pune (IN); Rama Subba Reddy Thavva, Bengaluru (IN)

(73) Assignee: Halliburton Energy Services, Inc., Houston, TX (US)

( * ) Notice: Subject to any disclaimer, the term of this patent is extended or adjusted under 35 U.S.C. 154(b) by 1034 days.

(21) Appl. No.: 17/297,237

(22) PCT Filed: Dec. 27, 2018

(86) PCT No.: PCT/US2018/067682
§ 371 (c)(1),
(2) Date: May 26, 2021

(87) PCT Pub. No.: WO2020/139344
PCT Pub. Date: Jul. 2, 2020

(65) Prior Publication Data
US 2021/0406792 A1 Dec. 30, 2021

(51) Int. Cl.
*E21B 43/26* (2006.01)
*E21B 41/00* (2006.01)
(Continued)

(52) U.S. Cl.
CPC ....... *G06Q 10/06313* (2013.01); *E21B 41/00* (2013.01); *E21B 43/2607* (2020.05);
(Continued)

(58) Field of Classification Search
CPC ....... G06Q 10/06313; G06Q 10/06393; G06Q 10/067; G06Q 30/0201; G06Q 30/0202;
(Continued)

(56) References Cited

U.S. PATENT DOCUMENTS 10,012,748 B2 7/2018 Gupta et al.
11,913,446 B2 2/2024 Mu et al.
(Continued)

FOREIGN PATENT DOCUMENTS

WO 201607646 A1 5/2016
WO 2017061993 A1 4/2017
(Continued)

OTHER PUBLICATIONS

Gu, M., Gokaraju, D., Chen, D., & Quirein, J. (2016). Shale fracturing characterization and optimization by using anisotropic acoustic interpretation, 3D fracture modeling, and supervised machine learning. Petrophysics, 57(06), 573-587. (Year: 2016).*

*Primary Examiner* — Bijan Mapar
(74) *Attorney, Agent, or Firm* — Michael Jenney; Parker Justiss, P.C.

(57) ABSTRACT

The disclosure is directed to methods to design and revise hydraulic fracturing (HF) job plans. The methods can utilize one or more data sources from public, proprietary, confidential, and historical sources. The methods can build mathematical, statistical, machine learning, neural network, and deep learning models to predict production outcomes based on the data source inputs. In some aspects, the data sources are processed, quality checked, and combined into composite data sources. In some aspects, ensemble modeling tech-
(Continued)

niques can be applied to combine multiple data sources and multiple models. In some aspects, response features can be utilized as data inputs into the modeling process. In some aspects, time-series extracted features can be utilized as data inputs into the modeling process. In some aspects, the methods can be used to build a HF job plan prior to the start of work at a well site. In other aspects, the methods can be used to revise an existing HF job plan in real-time, such as after a treatment cycle, a pumping stage, or a time interval.

24 Claims, 24 Drawing Sheets

(51) Int. Cl.
| | | |
|---|---|---|
| E21B 49/00 | (2006.01) | |
| G01V 20/00 | (2024.01) | |
| G06F 30/27 | (2020.01) | |
| G06Q 10/0631 | (2023.01) | |
| G06Q 10/0639 | (2023.01) | |
| G06Q 10/067 | (2023.01) | |
| G06Q 30/0201 | (2023.01) | |
| G06Q 30/0202 | (2023.01) | |
| G06Q 50/02 | (2024.01) | |
| G06Q 30/018 | (2023.01) | |

(52) U.S. Cl.
CPC .............. *E21B 49/00* (2013.01); *G01V 20/00* (2024.01); *G06F 30/27* (2020.01); *G06Q 10/06393* (2013.01); *G06Q 10/067* (2013.01); *G06Q 30/0201* (2013.01); *G06Q 30/0202* (2013.01); *G06Q 50/02* (2013.01); *E21B 2200/20* (2020.05); *G06Q 30/018* (2013.01)

(58) Field of Classification Search
CPC ...... G06Q 50/02; G06Q 30/018; E21B 41/00; E21B 43/2607; E21B 49/00; E21B 2200/20; G01V 20/00; G06F 30/27
See application file for complete search history.

(56) References Cited

U.S. PATENT DOCUMENTS

| | | | |
|---|---|---|---|
| 2011/0120702 A1* | 5/2011 | Craig | E21B 43/26 703/2 |
| 2014/0151033 A1 | 6/2014 | Xu | |
| 2015/0278407 A1* | 10/2015 | Vennelakanti | E21B 43/00 703/7 |
| 2016/0312552 A1 | 10/2016 | Early et al. | |
| 2017/0328179 A1 | 11/2017 | Dykstra et al. | |
| 2018/0259668 A1 | 9/2018 | Gu et al. | |
| 2018/0329113 A1* | 11/2018 | Walters | E21B 49/08 |
| 2018/0335538 A1* | 11/2018 | Dupont | G06N 20/20 |

FOREIGN PATENT DOCUMENTS

| | | |
|---|---|---|
| WO | 2020139344 A1 | 7/2020 |
| WO | 2020139346 A1 | 7/2020 |
| WO | 2020139347 A1 | 7/2020 |

* cited by examiner

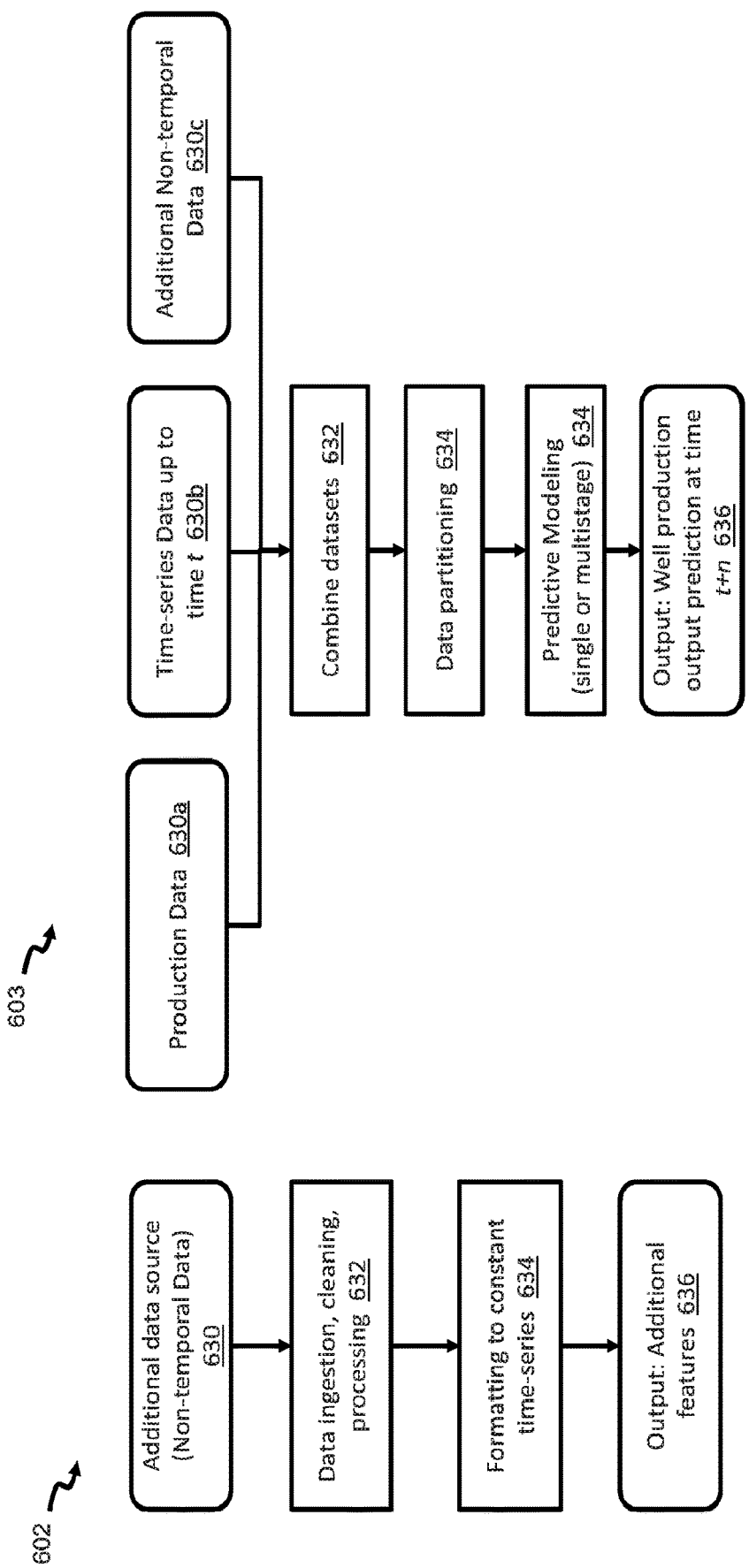

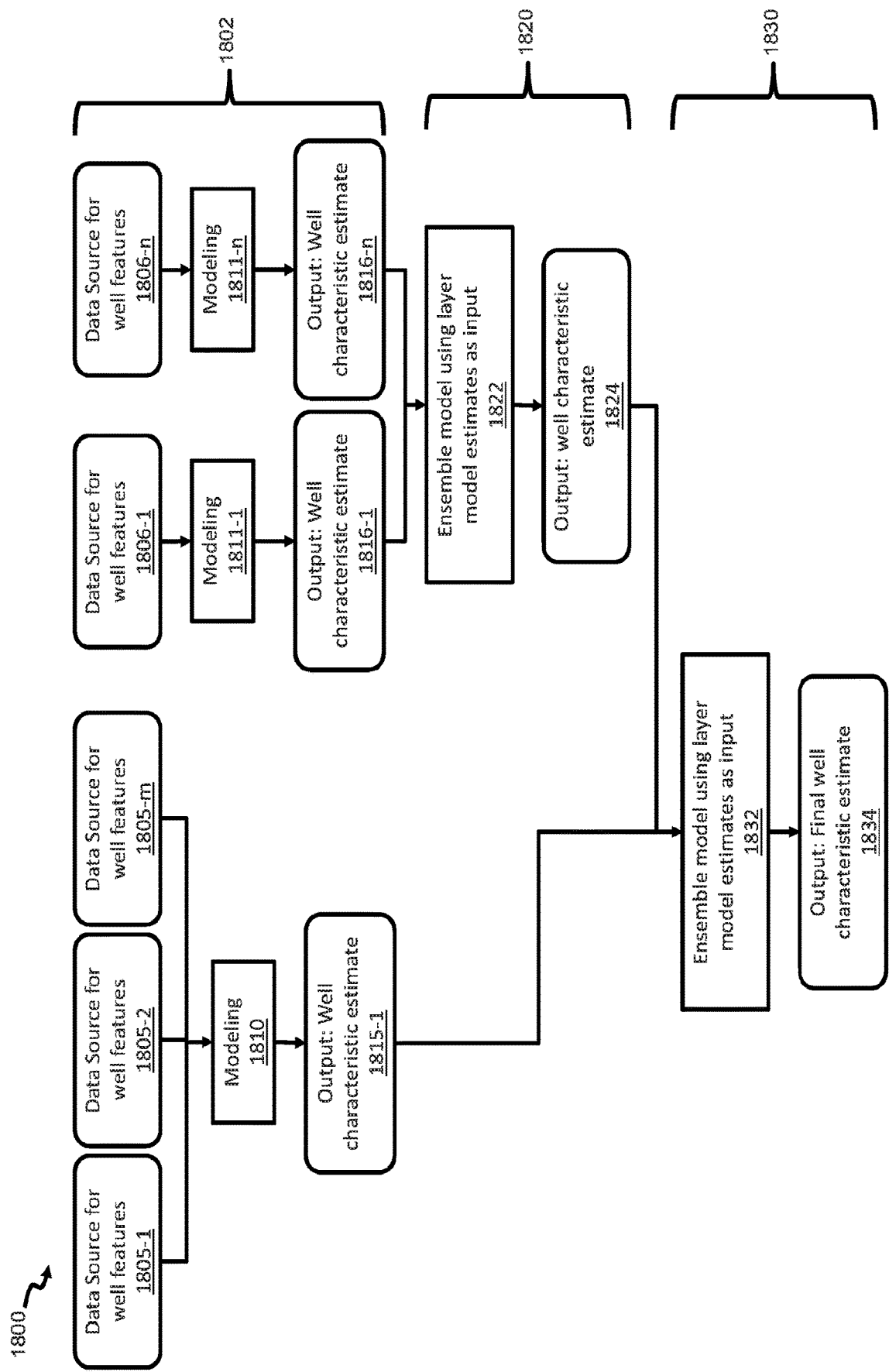

HYDRAULIC FRACTURING OPERATION PLANNING USING DATA-DRIVEN MULTI-VARIATE STATISTICAL MACHINE LEARNING MODELING

CROSS-REFERENCE TO RELATED APPLICATION

This application is the National Stage of, and therefore claims the benefit of, International Application No. PCT/US2018/067682 filed on Dec. 27, 2018, entitled "HYDRAULIC FRACTURING OPERATION PLANNING USING DATA-DRIVEN MULTI-VARIATE STATISTICAL MACHINE LEARNING MODELING," which was published in English under International Publication Number WO 2020/139344 on Jul. 2, 2020. The above application is commonly assigned with this National Stage application and is incorporated herein by reference in its entirety.

TECHNICAL FIELD

This application is directed, in general, to designing a hydraulic fracturing stimulation treatment job plan, and, more specifically, to utilizing multiple data sources and machine learning to design and modify a hydraulic fracturing stimulation treatment job plan.

BACKGROUND

Understanding the impact of stimulation and completion variables, i.e., features, on well production is important to improve the efficiency of hydraulic fracturing (HF) jobs. Some examples of stimulation features include fluid type, fluid volume, additive type and concentration, proppant type, size, concentration and mass, and pumping rate. Some examples of completion features include perforated length, number of stages, and number of perforation clusters. Additional features affecting well production include operator production practices and reservoir or spatial characteristics. The large number of features for a single well and across numerous wells in a region, location, basin, or county presents the need for large scale complex mathematical and statistical modeling. The relationships and interactions between these and other additional features are neither simple nor linear. Simple bilinear or multivariate linear models may not adequately explain the effect of the multiple input features on the well productivity outcomes. Well productivity and cost, together with efficiency and cost of the fracture stimulation treatment, determine the economic viability of the well and return on investment for the well operator.

Current approaches in modeling well production involve incorporating controllable (such as stimulation) features and uncontrollable (such as well location) features in the same statistical model. Often, well location, which can serve as a proxy for reservoir properties and operator practices, dominates the model accuracy and percentage of variance explained in the model error. Therefore, teasing out the effect of controllable features on production outcomes can be difficult. A more accurate modeling technique would be beneficial to predicting production outcomes using the many input feature types.

BRIEF DESCRIPTION

Reference is now made to the following descriptions taken in conjunction with the accompanying drawings, in which:

FIG. 6B is an illustration of a diagram of an example non-temporal data processing flow;

FIG. 6C is an illustration of a diagram of an example time-series predictive model flow;

FIG. 18 is an illustration of a diagram of an example ensemble model flow with independent and combined data sources, and a two-step ensemble model.

DETAILED DESCRIPTION

Figure 1:
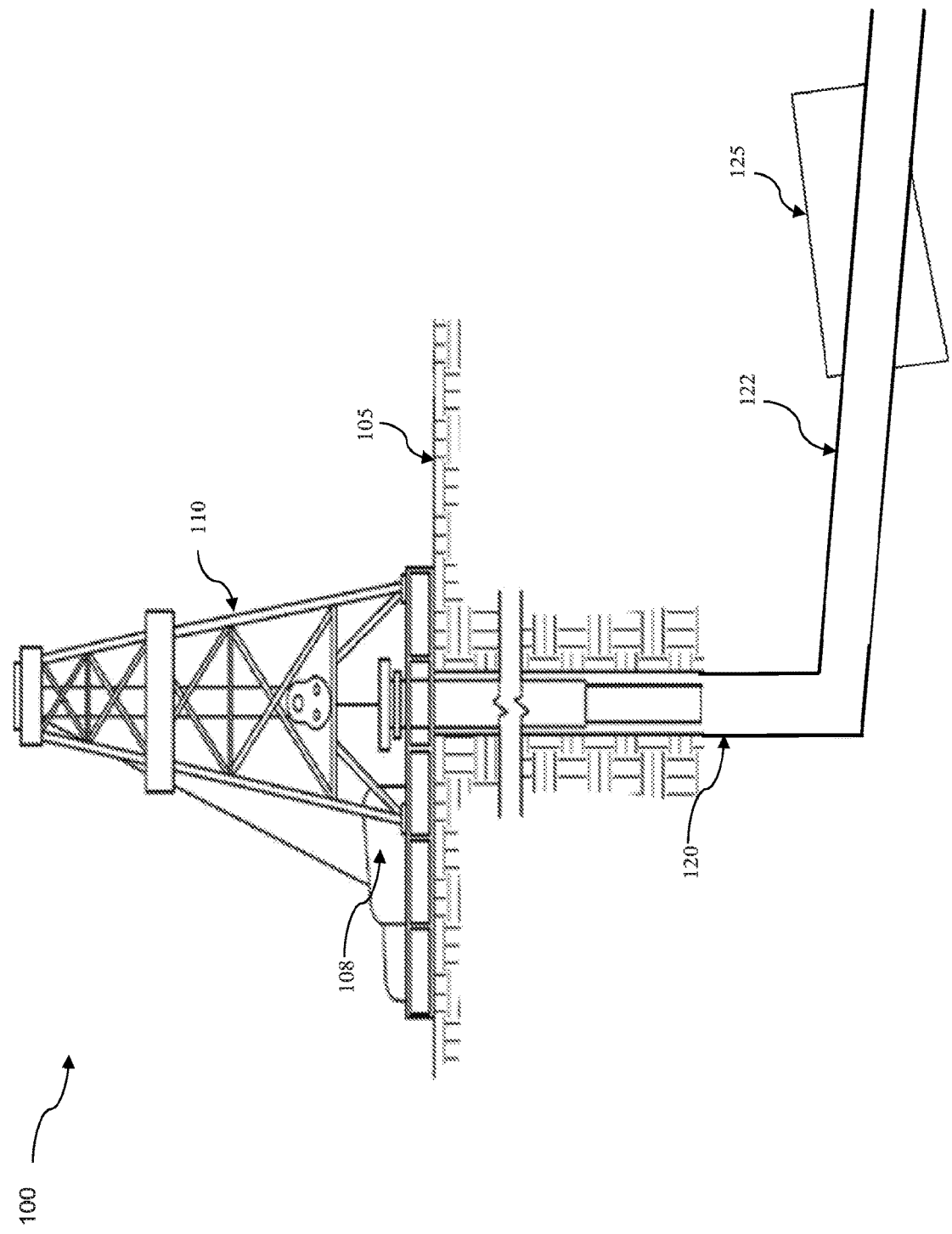
FIG. 1 is an illustration of a diagram of an example well site location.

In the oil and gas industry, methods have been developed to estimate well characteristics using various diverse modeling approaches. A well can be one of various types, such as an oil or natural gas production well. Well characteristics can include, for example, productivity, completion efficiency, drilling direction, and many other characteristics. These modeling approaches encompass and utilize concepts from many different technical domains, such as numerical method, physics-based modeling, earth and reservoir modeling, chemical engineering, and data driven statistical and mathematical modeling.

Each of these modeling approaches relies on unique assumptions, concepts, hypotheses, and parameters from that technical domain to estimate well characteristics. Attempts have been made to incorporate some of these approaches together to obtain a combined estimate that may increase accuracy in estimating the well characteristic of interest. Most of the combination techniques have been heuristics or rule based and may involve manual or subjective processing of information from different domains.

The modeling, simulation, or prediction insights gained from the various techniques can be useful to well engineers. The model predictions can be utilized prior to the start of development of a well site. The information can be used to build or modify a job design plan, i.e., a stimulation treatment operation plan. Once a well site has been started, other models can be used to monitor the progress of the well development and provide insight into modifications or changes to the job design plan that can provide a benefit. The benefit can be decreasing the time frame to hit a production goal, decreasing the cost to develop and work the well during the development and production phases, increasing the projected barrel of oil equivalent (BOE), increasing the net present value, return on investment, rate of return, or other economic indicator for the well following completion and production for a period of time, and impacting other key performance indicators or measures (KPI).

For example, conventional pumping decisions during hydraulic fracturing operations are generally not governed by data and statistics. Many decisions are subjective to the subject matter expertise (SME) of the fracturing crew. The decision-making process is geared towards executing a pre-determined pumping schedule (such as pumping 100,000 pounds (lbs.) of proppant in 30,000 gallons (gal) of fluid at 75 barrels per minute (bpm) for each treatment) or reacting to catastrophic deviations from expected outcomes (such as lowering the flow rate during a pressure increase caused by a screenout). This fixed and reactive approach does not optimize job results. It seeks to complete the job as designed, with little mechanism for accepting feedback during the job and modifying the design to enhance the outcome.

The techniques and models of the disclosures herein can be applied to various types of well sites. This application will use the hydraulic fracturing (HF) of horizontal wells as the well type to demonstrate the disclosures herein. The same methods could be applied to vertical, deviated, or otherwise oriented wells. Conventional approaches to HF design require a large number of parameters as input that is usually unknown or not reliable. There can be over 10,000 parameters, i.e., features, that can be input into the techniques and models. Some of the features can be well parameters, reservoir parameters, HF stimulation parameters, environment factors (such as geological formations, ground stability, offshore vs onshore, and other factors), equipment factors (such as the type of well equipment and monitoring equipment in use at a well site, and other equipment factors), operational feasibility (such as the ability to bring certain equipment on site, availability of SME, potential impact on neighboring locations, and other operational feasibility factors), and legal factors (such as laws in effect at the well site location, and other legal factors).

The significance and impact of each of these features on the KPIs can vary such that there can be 10, 100, or another number of features that are important for the analysis needed. The well engineers must often estimate several parameter values, which may add significant bias and uncertainty in the modeled predictions.

One dataset collected during HF pumping is time-series data containing information regarding fluids, proppants, chemicals, pressure, and other on-site field measurements and observations. This dataset can be leveraged for various applications and analysis. The HF time-series data captures information at regular and irregular time intervals. A grouping of time-series data can be an HF event. An HF event can be a treatment cycle, i.e., a job stage, pumping stage, diversion cycles, minifracs, step-up, step-down, sand slugs, screenouts, water hammer, and other events. Each HF event captured can have different characteristics, such as shape, scale, magnitude, and other characteristics. Currently, there is no defined process to identify and detect these events. Current industry practice includes manual detection or marking of the events by a user that introduces subjective variability, or a user guided method in a software system. These methods are not automated nor provide consistent and robust results.

This disclosure describes several enhancements to the process of determining a HF job design prior to beginning work at a well site and during active conducting of an HF stimulation on a well site. One aspect provides for data driven statistical modeling and machine learning algorithms that can be utilized to perform the modeling and generate prediction outcomes. Other aspects provide for a systematic, scalable, and robust framework of combining different modeling and estimation techniques to provide an enhanced estimate of the well characteristics. For example, well productivity can be estimated from earth models based on geological and reservoir information. It can also be estimated based on physics-based modeling techniques that rely on well geometry, fracture topology, and other factors.

Various data sources can contain unique and common information and parameters about the well site. When more than one data source is available, it would be desirable to join the different data sources to generate a combined data set for use in prediction and estimation of the well productivity. Modeling of predicted well production, or other KPI, can involve multiple different modeling assumptions and techniques, ranging from straightforward to very complex. One aspect of this disclosure can use an ensemble modeling technique. Ensemble modeling can be used to build a systematic way to incorporate diverse modeling techniques, methods, and data sources. This can be used to provide a more accurate estimate of well characteristics since the estimates can encompass a larger variety of information and parameters than analyzing each data source independently.

In another aspect, an automated detection of HF events based on HF time-series data can be generated. In addition to the presence or absence detection of an HF event, the start and end times of the HF event (HF event timeframe) can be identified. The HF event information can be utilized as modeling features for further estimations and predictions for the well site job operation plan, i.e., job plan.

From a well productivity perspective, identifying HF events can be a step in building a data driven model to determine the effectiveness of the stimulation job plan. From the time markers, aggregated values, such as the average pump rate, total proppant mass, fluid volume, and more complex derived properties, such as perforation and near wellbore friction, and other factors, can be determined or computed for use in the modeling process. From a surface efficiency perspective, the HF events can serve as operational metrics, such as the number of screenouts per 1000 treatments and planned sand slugs vs the actual number. In addition, an automated post job report generation after a HF treatment can be an optional component.

In this aspect, a machine learning or data drive statistical modeling approach can be utilized, with the time-series pumping data, such as treating pressure, slurry rate, proppant concentration, user defined event flags, and other factors, to characterize the HF event (such as treatment, cycle, mini-frac, and other event types) and derived parameters (such as fracture gradient, slopes, averages, weighted averages, and other derived parameters). This information can be utilized to build a well site job plan.

Utilizing real-time or near real-time information, monitoring and improvements of the well site job plan can be implemented. Real-time, for the purposes of this disclosure, means information and data collected or received from a well site equipment or monitoring equipment at a well site within a time interval, for example, 1 second, 2 hours, or another time interval. Real-time processes and events as used herein is inclusive of near real-time processes and events. Non-real-time collected data and information is received from stored data or historical data and may not be sourced from the target well site.

In another aspect prior to implementation of a job plan, a multi-stage data analytics method to maximize well productivity can be used to develop the job plan. The analytics method can automate processing of large-scale data from a variety of public and proprietary sources to prepare and extract standard and novel parameters. It can decouple spatial variability, i.e., uncontrollable features, from stimulation parameters, i.e., controllable features. It can also utilize uncharacteristic design parameters that capture variation in job designs along the lateral section of horizontal wells for building predictive machine learning models. The analytics method can also identify and recommend optimal and customized design features, i.e., variables, for HF job plans.

These various aspects can be utilized separately or in combination to maximize value for a well site production. Data driven decisions prior to, or in real-time can be determined to satisfy customer defined KPIs by predicting likely outcomes and recommending well site job plan design changes.

In one aspect of this disclosure, training a model can be conducted to lead to higher quality outputs of the various respective models. First, a determination of manual or previous machine learning based identification of HF events from historical or other completed HF treatments can be collected into a dataset. The dataset can be one or more datasets, or an ensemble dataset. The dataset can be split into two or three portions. A training portion, a validation portion, and an optional testing portion. The training portion can be used to train a machine learning model. The validation portion can be used to validate the training model.

After training and validation have been completed, various models can be run against the dataset and the model can be selected that yields the outcomes desired by the customer KPIs. The testing portion can be used for this analysis. This model can then be used for the well site job plan. This type of HF event detection methodology is used in the industry for fault and anomaly detection with respect to equipment failure, such as drilling pipe stuck events and electrical submersible pump (ESP) failure. It is not being used for a machine learning based approach to solve multi-variate HF time-series event detection and its timeframe determination situations.

Figure 2:
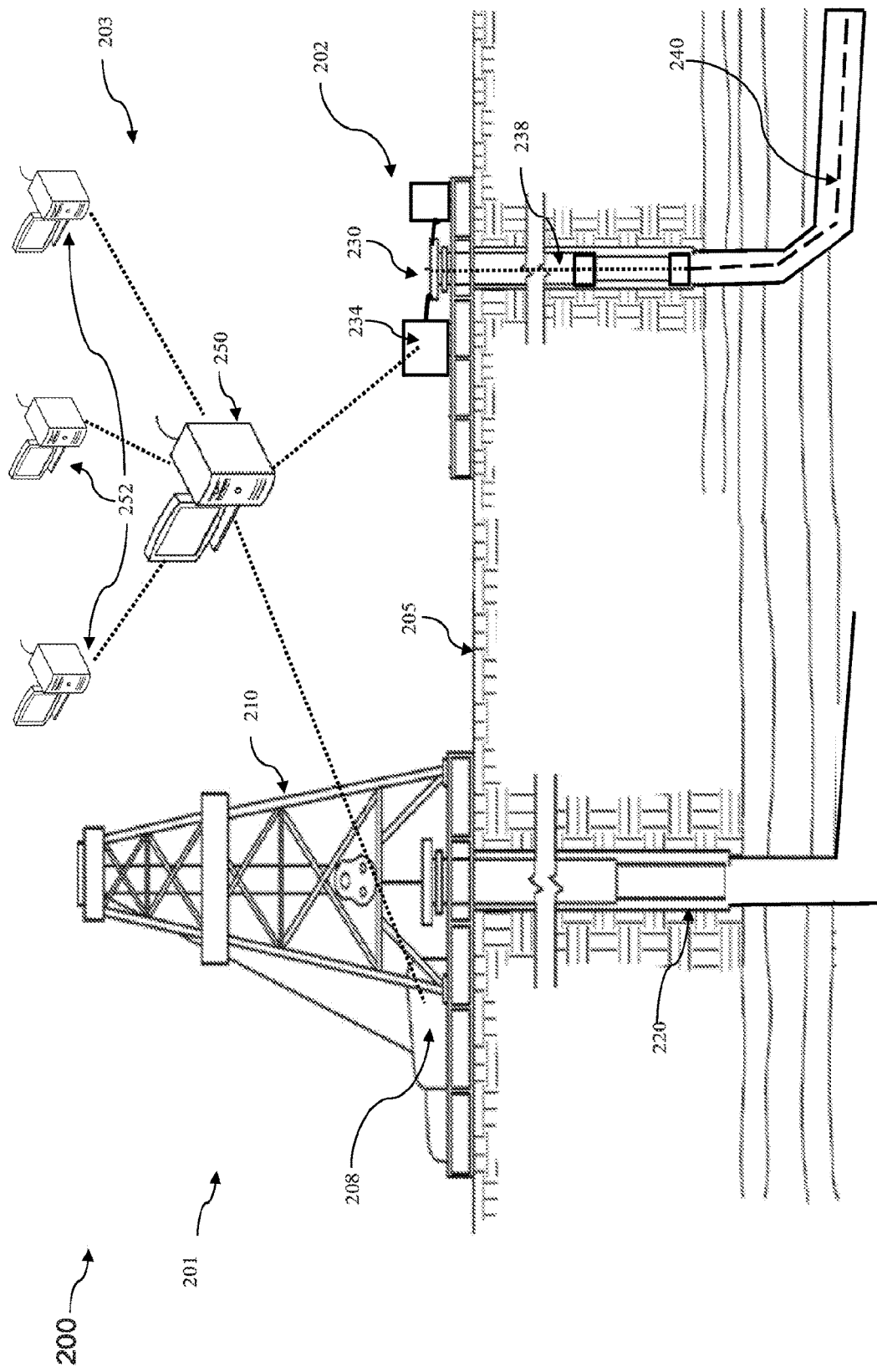
FIG. 2 is an illustration of a diagram of an example multiple well system.
Figure 4:
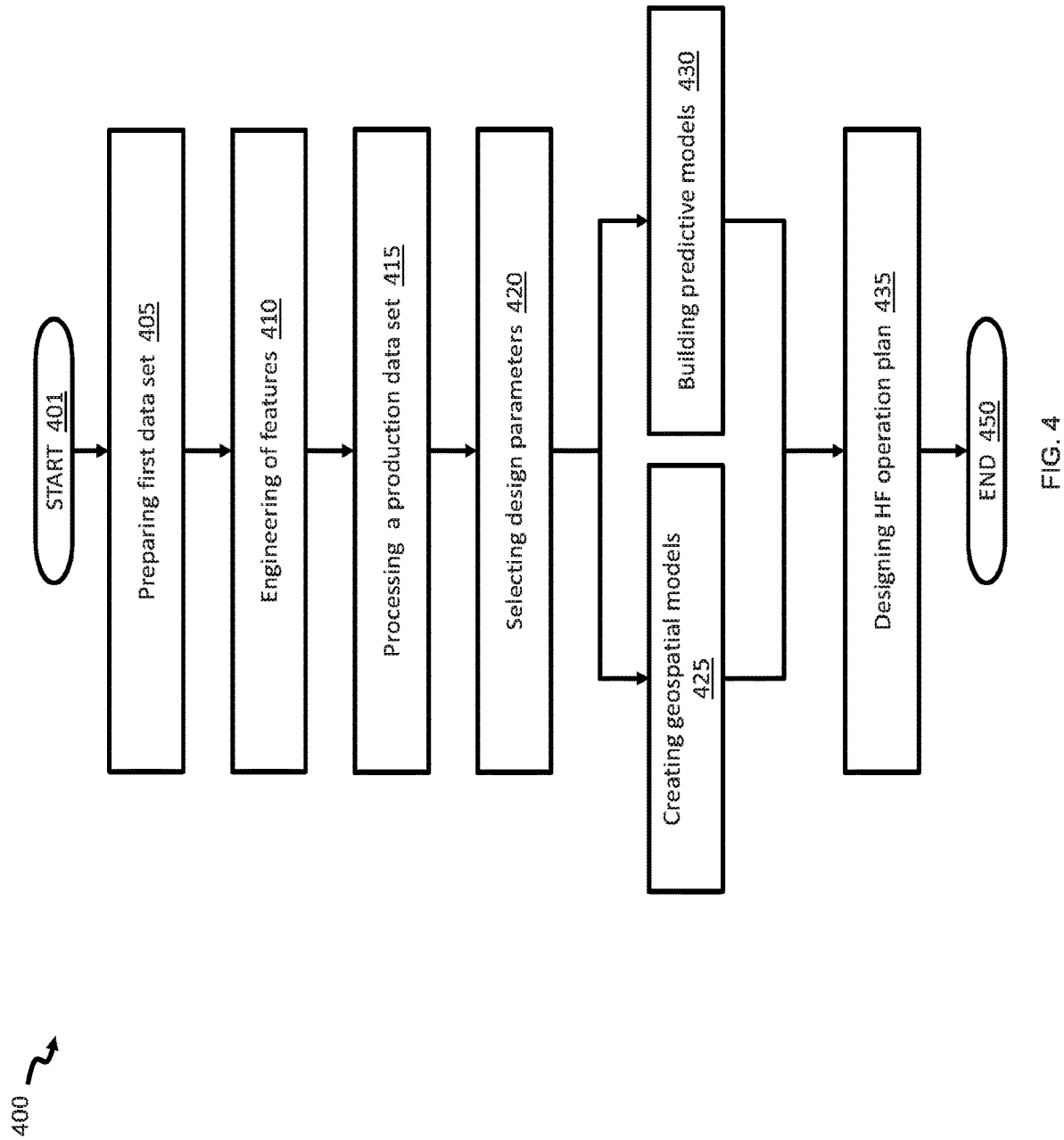
FIG. 4 is an illustration of a flow diagram of an example HF job design method.
Figure 5:
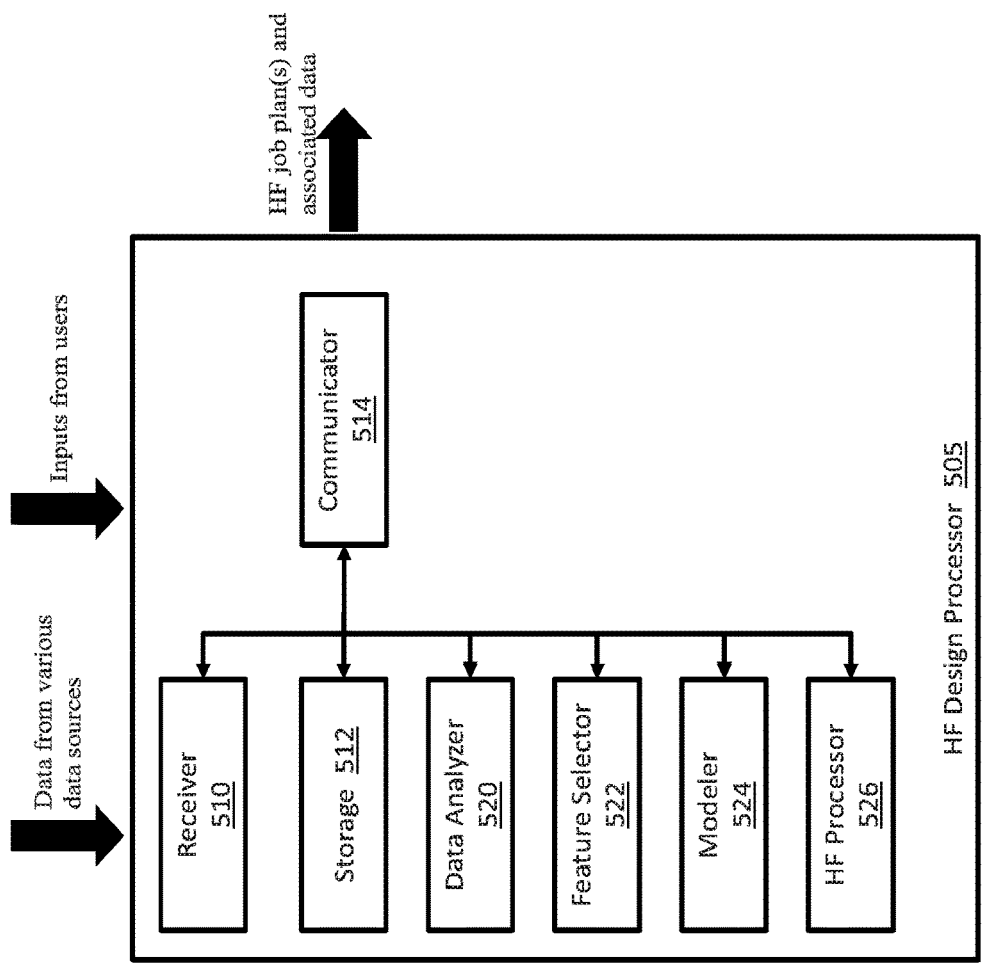
FIG. 5 is an illustration of a block diagram of an example HF design system.

Turning now to the figures, FIGS. 1 to 2 demonstrate example well systems to which the various aspects disclosed herein can be applied. FIGS. 3 to 5 demonstrate examples of applying the disclosure to the pre-job design phase, i.e., non-real-time application. HF job plans can be developed and modified based on the modeling demonstrated in these figures. FIGS. 6 to 7 demonstrate examples of applying the disclosure to real-time job executions. HF treatments in progress can be monitored and revised models can be generated that can confirm the HF job plan or recommend changes to the HF job plan. FIGS. 8 to 11 demonstrate alternate techniques to model various treatments and job design parameters, specifically around response features, such as pressure, flow distribution, and fracturing dimensions. FIGS. 12 to 13 demonstrate techniques to detect and monitor response features and events within a well system. FIGS. 14 to 18 demonstrate variations of ensemble modeling.

FIG. 1 is an illustration of a diagram of an example well site location 100. Well site location 100 can be the target well site for the HF job plans that are designed or modified using the methods disclosed herein. Well site location 100 includes well equipment 110 located at surface 105 and well controller 108 located proximate to well equipment 110. Well equipment 110 can include, for example, drilling rig, surface production wellhead, and other equipment to construct and produce the well. Well controller 108 can include, for example, drilling equipment, completions equipment, pumping equipment, monitoring equipment, and production equipment. Prior to the stimulation treatment, well controller 108 may also include computing equipment to execute the job plan and to perform the modeling as disclosed. Alternatively, the modeling and data computing equipment can be located a distance from well site location 100, such as in a data center, server, or other remote location.

Extending below well equipment 110 is a wellbore 120. Wellbore 120 bends and becomes more aligned approximately horizontally, as shown by horizontal wellbore 122. A fracture 125 is shown for demonstration of a location of a planned hydraulic fracture to be created by a planned HF job design.

FIG. 2 is an illustration of a diagram of an example multiple well system 200. Multiple well system 200 includes a well site 201, a completed well site 202, and a computing system 203. Well site 201 includes well equipment 210 located at surface location 205 and well controller 208. Extending below well equipment 210 is a wellbore 220. Wellbore 220 is a horizontal wellbore designed for fracturing operations.

Completed well site 202 includes a completed well 230 and well controller and monitor 234. Extending below completed well 230 is a wellbore 238. Wellbore 238 is a horizontal wellbore designed for fracturing operations. Interior to wellbore 238 can be a sensing device 240, for example, an acoustic sensor or fiber optic cable. Sensing device 240 can be used to gather time-series feature data and response feature data that can be used as inputs to the various modeling algorithms described herein. Other devices, on surface and in the wellbore, can be used as well to gather the time-series and response feature data.

Computing system 203 can include one or more computing devices, cloud storage and processing systems, distant data centers, on-site data centers, servers, and other types of computing systems. A computing device can be a server, laptop, smartphone, dedicated well equipment, distributed processing system, and other types of computing devices. Computing system 203 can include a HF design system 250 (see FIG. 5) and one or more data sources 252. HF design system 250 can execute the methods, algorithms, and techniques described herein. Well controller and monitor 234 can relay surface and downhole conditions and measured values before, during, and after the fracture stimulation treatment to the HF design system 250.

Data sources 252 can be located with HF design system 250, be located proximate to HF design system 250, or be located a distance from HF design system 250. Data sources 252 can be stored in a database, a hard drive, CD, DVD, USB, memory, server, data center, cloud storage, and other storage mediums and locations. Data sources 252 can be public data sources, private or confidential data sources, proprietary data sources, historical data sources, and other data source types.

HF design system 250 can be communicatively coupled to the data sources 252, and communicatively coupled to one or more well sites, such as well site 201 and completed well site 202, where such communicative coupling is shown by the dotted lines. The information collected from the data sources 252 and from sensing device 240 can be used by the HF design system 250 to build a new or revised HF job plan. Depending on the model being built, the data sources 252 or the sensing device 240 data can be optional. HF design system 250 can execute the methods and algorithms to build models prior to a job design being executed, or in real-time such as after a treatment cycle.

In multiple well system 200, data gathered from one well, such as the completed well 202 can also be used as input data to the HF design system 250 when building or revising a HF job plan for well site 201. Other combinations are possible as well. For example, there can be more than two well sites at a location, where one or more of those well sites are contributing data to HF design system 250.

Figure 3A:
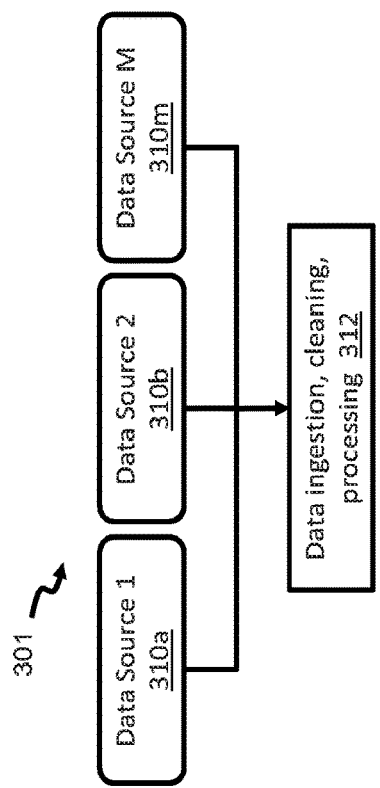
FIG. 3A is an illustration of a diagram of an example data preparation flow.

FIG. 3A is an illustration of a diagram of an example data preparation flow 301. Data preparation flow 301 handles large scale ingestion, handling, cleaning, and processing of data from a variety of public and proprietary data sources. The process can include joining and validating data across different sources, performing statistical and descriptive analysis on the data, and identifying outlier data elements.

There can be one or more data sources, where three data sources are modeled for demonstration purposes as 310a, 310b, and 310m. The data sources 310 can be public data sources, for example, Drillinginfo, IHS, RigData, Rystad, RS Energy, FracFocus, national or state government oil and gas agencies, and other public sources. Data sources 310 can also be proprietary data sources, for example, HF job data from previous HF well sites, customer data, sales data, well cuttings, core, log, survey, and other data from the HF or other wells, seismic and other geology and reservoir data, and other proprietary or confidential data sources. The relevant data from each of the selected data sources 310 can be ingested, cleaned, and processed, as shown in flow 312. A series of quality checks and outlier removal processes can be applied to improve data quality at various processing steps. Imputation can be used to fill in missing values. Outlier data can be excluded. After the data has been processed and passed quality checks, the data from disparate sources can be combined together based on the common information available between the data sources 310, for example, well API (American Petroleum Institute unique well identifier), well name, well number, and other data elements.

Figure 3B:
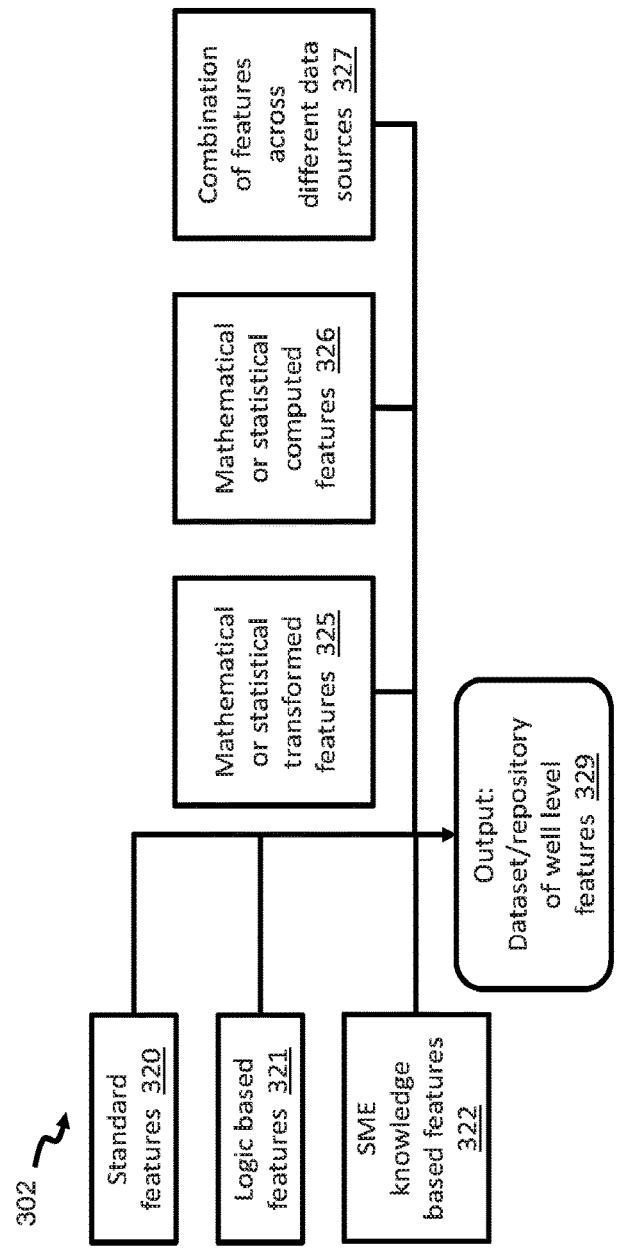
FIG. 3B is an illustration of a diagram of an example feature engineering flow.

FIG. 3B is an illustration of a diagram of an example feature engineering flow 302. Feature engineering flow 302 includes extracting one or both standard and engineered features for use within the model building stages. The engineered features can be mathematical or statistical transformation of data, statistical or mathematical computation of derived features, SME knowledge driven, logic or rule-based features, or a combination of features across different data sources.

The feature engineering flow 302 takes as input the processed data from data preparation flow 301. The data can be analyzed and categorized. Standard features 320 include traditional and commonly available information about the well, for example, the well name, well number, API, spatial location, lateral length, measured depth, true vertical depth, and other information.

Logic based features 321 can be computed. Logic based features 321 can be computed using statistical or mathematical transformations 325 or computations 326 of standard features 320 or other types of features. The computation and usage of these designed features are distinctive to this disclosure. For example, a computed feature can be a toe-to-heel or stage-to-stage variation of proppant amount, fluid volume, maximum proppant concentration, proppant mesh size, pad fraction, fluid type, and other computed features. SME knowledge-based features 322 can be identified for the targeted well site. For example, for a new location, SME geological knowledge can be utilized since neighboring wells' data may not be available for the modeling process.

Features can be combined across different data sources as shown in flow 327. This can assist the analysis when certain features are at the well site level and other features are at the stage level, i.e., treatment cycle. The treatment and pumping stage level features can be statistically aggregated at the well level while maintaining enough information to build a well level model. The collective output of feature engineering flow 302 can be a dataset or repository of well level features 329.

Figure 3C:
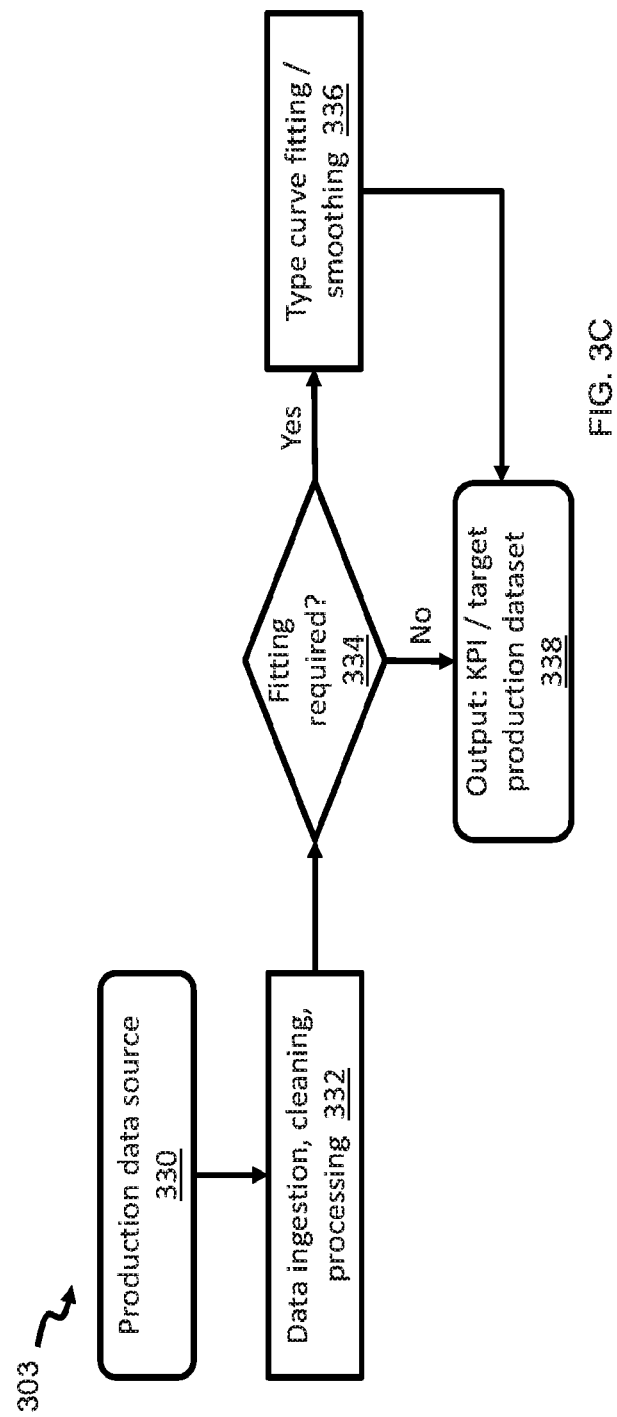
FIG. 3C is an illustration of a diagram of an example production data processing flow.

FIG. 3C is an illustration of a diagram of an example production data processing flow 303. Data processing flow 303 includes processing and cleaning of the production data to result in a cleaned production metric which can be used as a target variable for modeling. A type curve can be fitted, such as using the Arps equation or similar, to reduce noise in production data, overcome production reporting issues, and estimate production values per well, for example cumulative 180-day production outcomes and estimated ultimate recovery targets.

Depending on the region, the production data source 330 may have limited availability in the public domain or it may not be trustworthy. The production data can be ingested, cleaned, and processed, as shown in flow 332. One or more quality checks can be applied. Imputation can be used to fill in missing values. Outlier data can be excluded. In the decision flow 334, a determination can be made whether type fitting would be beneficial for the ingested data. If 'Yes', then a type curve, shown in flow 336, or another type of smoothing method can be applied to reduce noise and correct for erroneous production data, or to identify wells for which the production data is unusable and should be removed from the dataset. An appropriate target production value, i.e., KPI, is computed from the smoothed or fitted data. The KPI can be, for example, a 30-day, 90-day, 180-day, 365-day, a maximum initial production, an estimated ultimate recovery (EUR), or other rolling cumulative production outcome. In flow 338, the KPI can then be combined with other well level features to generate a dataset to be used in the modeling steps.

Figure 3D:
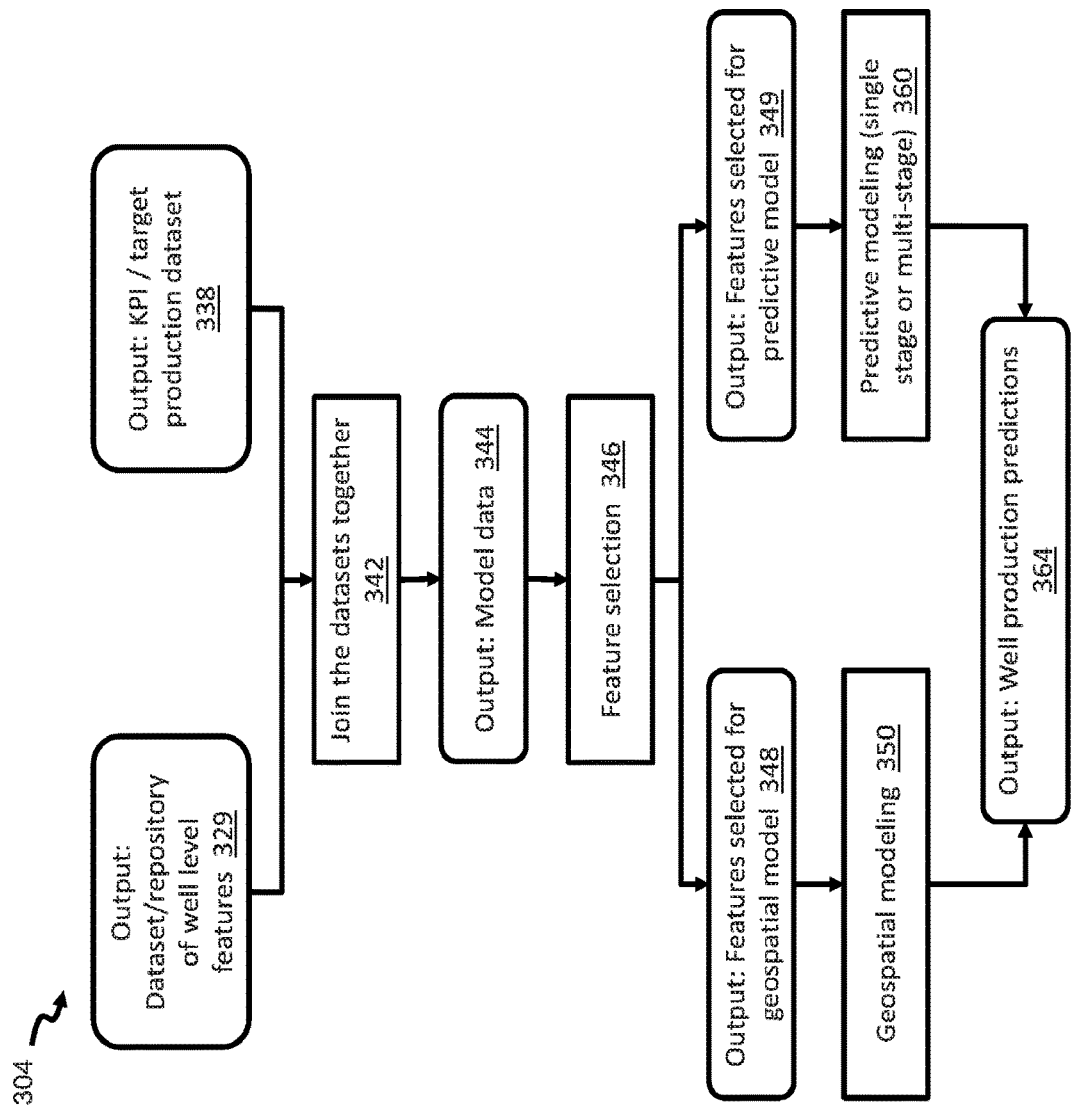
FIG. 3D is an illustration of a diagram of an example statistical or machine learning predictive modeling flow.

FIG. 3D is an illustration of a diagram of an example statistical or machine learning predictive modeling flows 304. This can include a single predictive model or multistage model consisting of geospatial and predictive models. Modeling flows 304 include a first step to determine a feature selection. After joining the production data, as described in FIG. 3C, with well-level features, as described in FIG. 3B, a feature selection can be performed to reduce dimensionality of feature space, find relevant input features, or build simpler models using small number of features. Features are selected to be applied within one or both geospatial and predictive models. In some aspects, a single model can be built for the selected features. The geospatial modeling includes building a predictive geospatial model for well productivity based on spatial location parameters using mathematical techniques, such as universal kriging, decisions trees, or other machine learning methods. This can decouple the effect of the well location, which is an uncontrollable feature, from the stimulation parameters, which are controllable features. The predictive modeling includes using stimulation parameters along with additional relevant features to build a predictive model for well productivity. Information can be shared between the geospatial and predictive models.

The output of the feature engineering flow 302 is represented by the flow 329. The output of the production data processing flow 303 is represented by the flow 338. The combined dataset of production and well level features is represented by flow 342. The output of the model data is flow 344. From the output of the model data flow 344, feature selection can be performed as shown in flow 346.

The selection process in flow 346 can be achieved through many standard techniques and algorithms, for example, forward step-wise selection, backward step-wise selection, correlation analysis, lasso regression, ridge regression, elastic net regression, other techniques, and a combination of these techniques. Features can also be selected based on domain or SME knowledge. Flow 346 can select the same, different, or some same and some different features for each of the subsequent modeling steps, such as the output for the geospatial model flow 348 and the output for the predictive model flow 349. Flow 346 can also enable dimensionality reduction of the feature space along with decoupling the impact of relevant features from non-relevant features in predicting well production output.

In the geospatial modeling flow 350, the previously prepared data can be divided into three separate classes: (1) training data, (2) validation data, and (3) test data. Training data can be leveraged to build one or more models. Validation data can be used to evaluate the model performance and select a modeling algorithm. A geospatial model can be built using features that characterize well spatial location, either two or three dimensionally, and well completion parameters. Techniques such as universal kriging, random forest, and other machine learning methods can be used to build the models. The test data can be used to ensure model robustness and predictive power. The model resulting in the highest accuracy can be selected as the geospatial model to be used for the output of well production predictions flow 364.

In the predictive modeling flow 360, the data can again be divided into three classes (train, validate, test). The division of the data can be the same or different from the geospatial model division of data. The KPI can be the residual production (predicted well production output from the geospatial model) or it can be the actual well production output. A predictive model can be built using stimulation parameters, therefore decoupling the effect of location from the HF design parameters. One or more statistical and mathematical modeling techniques can be tested to build the model, for example, linear regression, non-linear regression, support vector machine, random forest, gradient boost, neural networks, deep learning, and other techniques. The algorithm resulting in the highest accuracy or with the best fitted data can be selected as the final predictive model. The evaluation of the algorithm and model performance can be achieved through cross validation, such as 5-fold or 10-fold cross validation. The selected model can output the predictive model well production predictions in the output of well predictions flow 364.

Figure 3E:
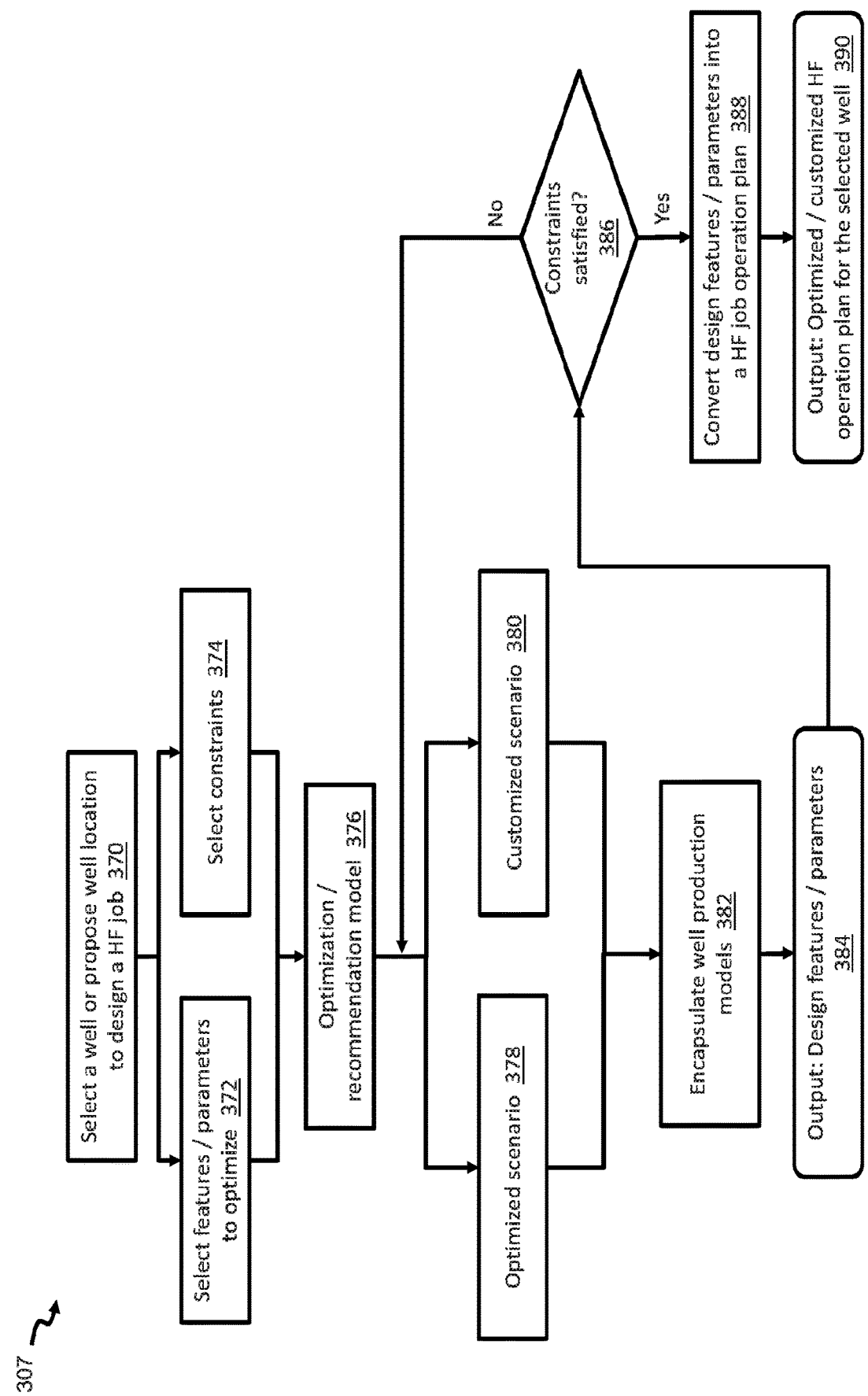
FIG. 3E is an illustration of a diagram of an example hydraulic fracturing (HF) job design flow.

FIG. 3E is an illustration of a diagram of an example HF job design flow 307. HF job design 307 includes building an optimized model based on a list of input parameters, such as the parameters used for the geospatial and predictive models, to maximize or optimize well production in regard to a designated KPI metric. The HF job design 307 process can generate one or more potential job designs, where each optimizes a pre-defined objective function, or KPI, under given constraints for a given set of parameters. The potential job designs can then be validated under operational constraints and feasibility. The final recommended job design can be selected after the analysis is completed.

A pre-determined well can be selected or a well site can be identified for which the HF job design will be built, and is represented by flow 370. A list of features is selected for optimization in flow 372. These features can be selected from the features used to build the geospatial model and the predictive model. A set of constraints can be selected, as represented in flow 374. The constraints can be pre-defined or customized by a user of the process. The constraints can include operational feasibility, cost factors, and other constraint types.

An optimization algorithm, for example, a genetic algorithm, pattern search, differential evolution, and other types, can be used for the list of features within the provided constraints to generate multiple iterations and scenarios to optimize the objective function, as shown in flow 376. The most optimized scenario or one or more potential scenarios can be considered as potential designs for the HF job, shown as flow 378. Users of the process can provide their own estimates and ranges for one or more features in the list to optimize. This can create custom scenarios, shown as flow 380. Flow 382 encapsulates the previously presented statistical or machine learning predictive modeling flows 304. In flow 382, the resulting HF designs can be input to flow 304 to generate predicted well production or other KPI based on the scenario parameters. The output of 382 is the resulting output from the output of well predictions flow 364.

The output from the analyzation process, flow 384, can then be evaluated against the constraints to test that the constraints are satisfied, as shown in decision flow 386. If the constraints are not satisfied, the process can loop back to flows 378 and 380 to adjust the scenarios or to select a different scenario. If the constraints are satisfied, the design models can be converted into an HF job plan, including pumping schedule level job parameters, as shown in flow 388. The HF job plan can be output and utilized by field engineers to implement the HF job design, as shown in flow 390.

FIG. 4 is an illustration of a flow diagram of an example HF job design method 400. Method 400 starts at a step 401 and proceeds to a step 405. In the step 405, the process can prepare the first data set as shown in FIG. 3A. One or more datasets can be ingested, cleaned, and processed, rendering the datasets available for further analysis within the method 400. Proceeding to a step 410, engineering of features can be conducted, as shown in FIG. 3B. Features can be identified from the datasets, and additional features can be computed or transformed from the datasets. In addition, SME knowledge can be applied to identify additional features.

In a step 415, a second set of data, i.e., a production data set, can be processed, as shown in FIG. 3C. Production data from various sources can be ingested, cleaned, and processed. The data can then be analyzed to determine if a fitting or smoothing algorithm should be applied to the data. Outliers can be removed if they do not fit the curve. In a step 420, data sets from steps 410 and 415 can be combined to create a larger model data set, as shown in FIG. 3D. The design parameters can be selected from the combined datasets for each of the models that will be built. The selected features can be the same, different, or overlap between the various models that are built.

Proceeding to a step 425, zero or more geospatial models can be created using the selected features from step 420 that were selected for geospatial modeling (see FIG. 3D, elements 348 and 350). Separately, in a step 430, zero or more predictive models can be created using the selected features from step 420 that were selected for predictive modeling (see FIG. 3D, elements 349 and 360). Various techniques and algorithms can be utilized to build the models. At least one of the steps 425 and 430 should be selected, with the other step being an optional selection.

After steps 425 and 430 have completed, the method 400 proceeds to a step 435. In the step 435, the various geospatial and predictive models can be evaluated against various criteria and constraints (see FIG. 3E). Models can be optimized for cost, short term production outputs, long term production outputs, and other KPIs. The model that best fits the constraints and KPI goals provided can be selected and converted into a HF job plan. The HF job plan can then be utilized by well engineers and operators, and by well site equipment. The method ends at a step 450.

FIG. 5 is an illustration of a block diagram of an example HF design system 500. HF design system 500 includes a HF design processor 505. HF design processor 505 includes a receiver 510, a storage 512, a data analyzer 520, a feature selector 522, a modeler 524, a HF processor 526, and a communicator 514. Data from various sources, public sources and confidential/proprietary sources, can be received by receiver 510. Receiver 510 can also receive various user inputs, such as SME knowledge, domain knowledge, user defined constraints, and other information. Receiver 510 can be a conventional communication system, such as a network connection, wireless connection, wired connection, or other communication types. The data can be stored in storage 512. Storage 512 can be a conventional storage medium, for example, a database, a hard drive, CD, DVD, USB memory, a cloud storage, a server, a data center storage area, and other storage medium types.

HF processor 526 can execute one or more applications and processes to perform the methods as described herein. HF processor 526 can manage the data stored in storage 512, and issue instructions to data analyzer 520, feature selector 522, and modeler 524 to complete the method steps. Data analyzer 520 can clean and process the data received by receiver 510 and store the processed data back into storage 512. Feature selector 522 can select features to be used in the modeling processes from the data stored in storage 512. Modeler 524 can generate geospatial and predictive models using the features selected in feature selector 522 and data stored in storage 512.

Communicator 514 can communicate the HF job plans selected by the HF processor. This can typically be the most optimized HF job plan based on the constraints provided. In other aspects, more than one HF job plan can be provided. Communicator 514 can communicate with a user, such as using a monitor, display, mobile device, or printer, and the communicator 514 can communicate with other systems, such as a storage medium, data center, server, cloud-based system, well site equipment, and other computing systems. The communication can be via a conventional communication means, such as a network protocol, wireless connection, wired connection, directly to a storage medium, and other communication types.

HF design system 500 is demonstrating an example system to implement the methods described herein. HF design system 500 is a logical description of the functionality. The functionality can be combined or separate. For example, storage 512 can be located at a distance in a data center. Data analyzer 520, feature selector 522, and modeler 524 can be combined with HF processor 526 where the different processes can be executed by one or more applications on a central processing unit (CPU), graphics processing unit (GPU), single instruction multiple data (SIMD) processor, and other processor types.

Figure 6A:
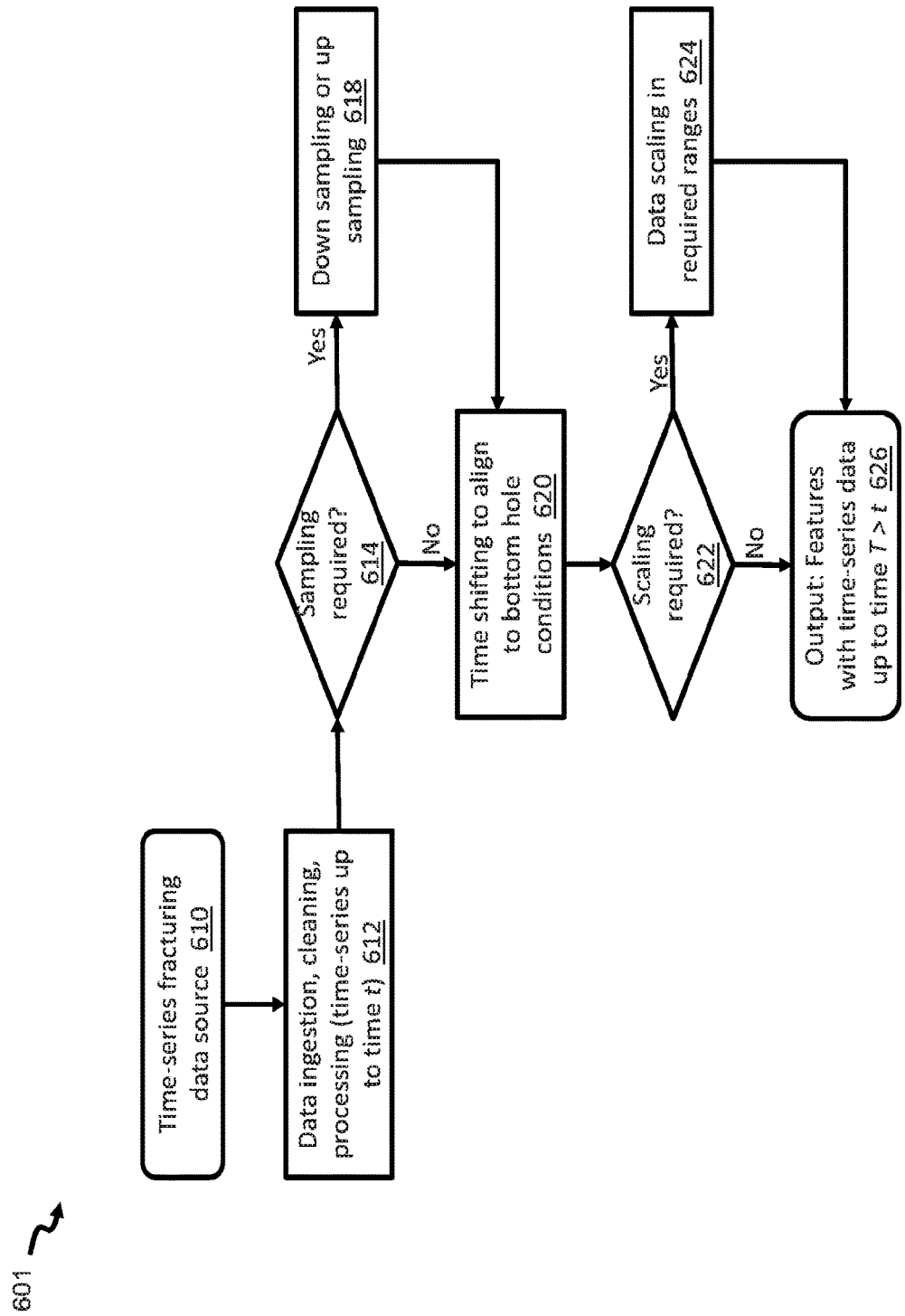
FIG. 6A is an illustration of a diagram of an example time-series data processing flow.
Figure 7:
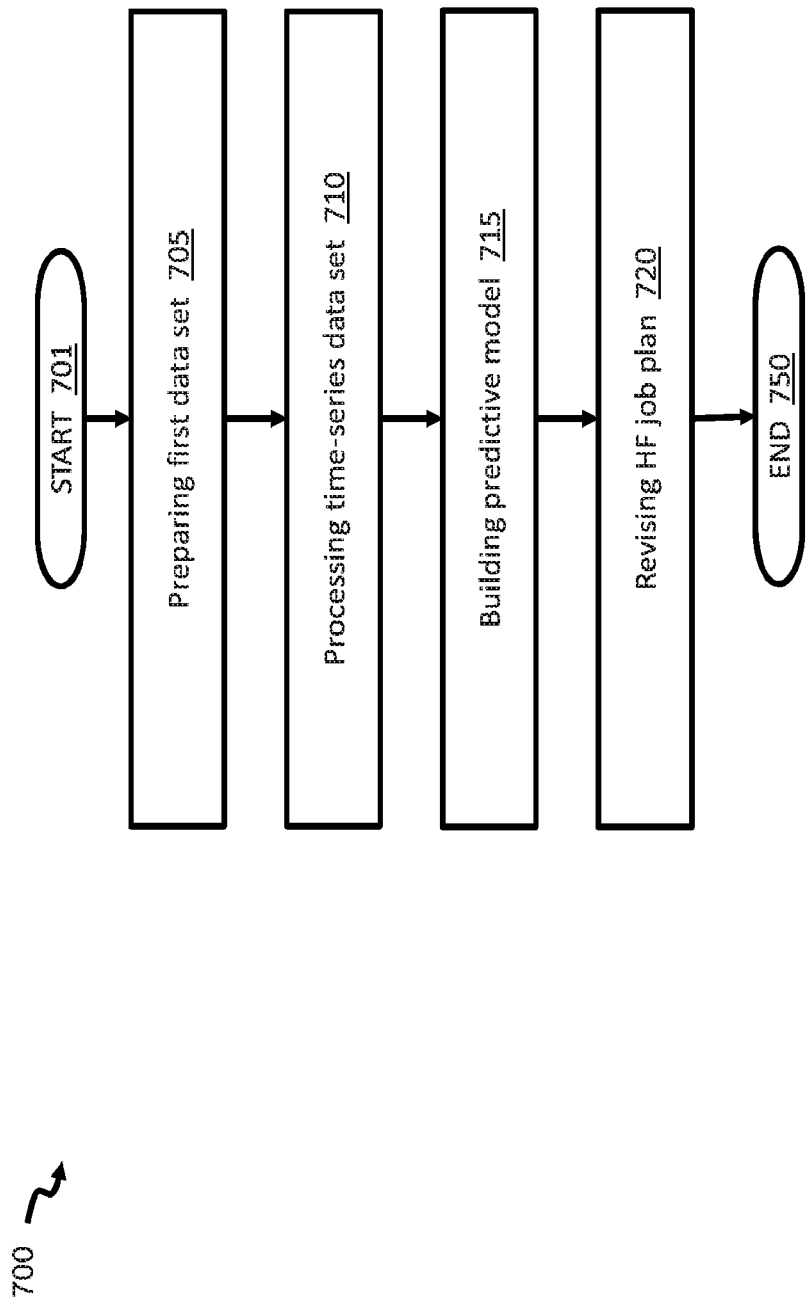
FIG. 7 is an illustration of a flow diagram of an example time-series HF job design method.
Figure 8:
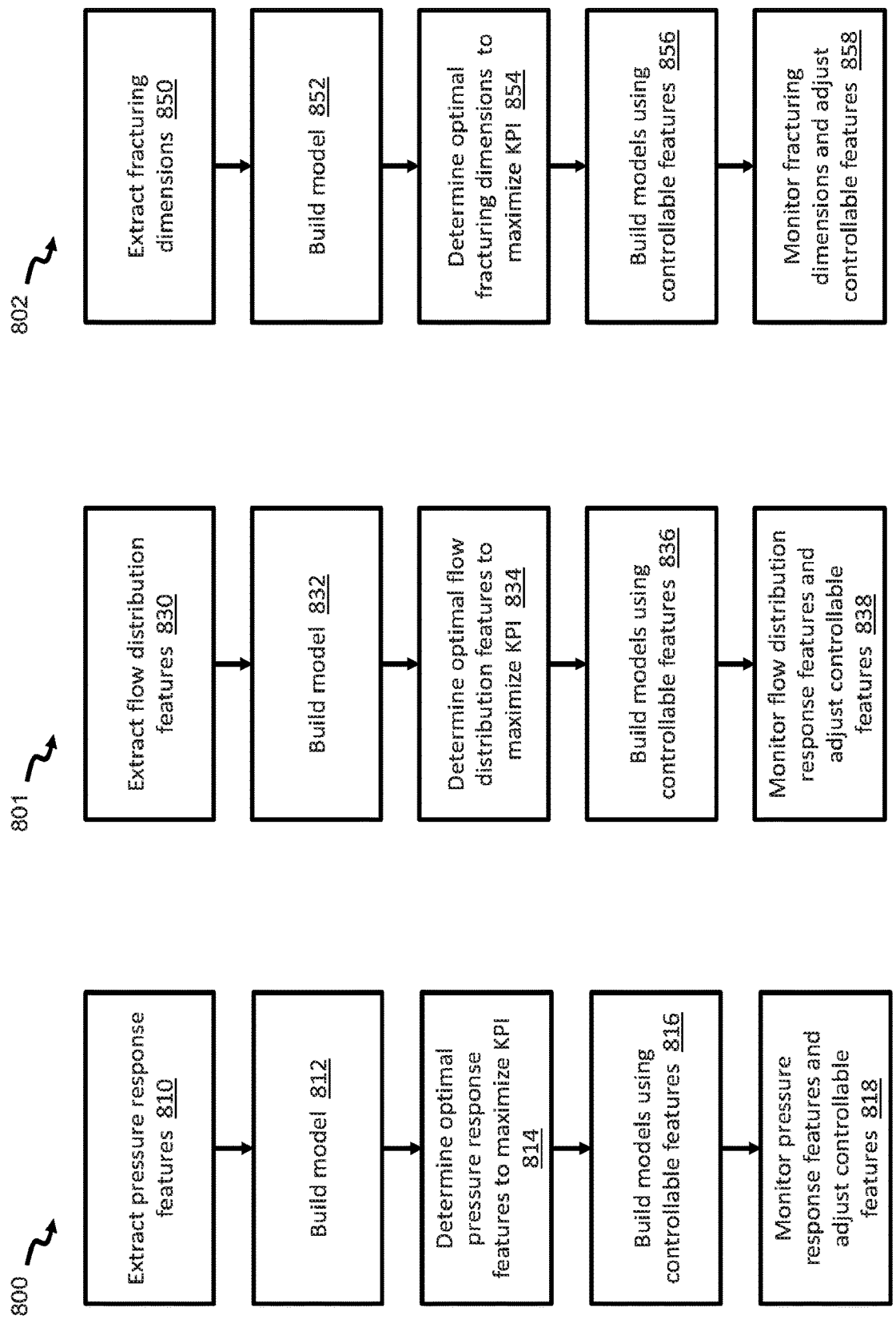
FIG. 8A is an illustration of a diagram of an example pressure response feature flow.
FIG. 8B is an illustration of a diagram of an example flow distribution feature flow.
FIG. 8C is an illustration of a diagram of an example fracturing dimensions flow.

FIG. 6A is an illustration of a diagram of an example time-series data processing flow 601. The process can leverage time-series data along with well characteristics to build a statistical model to predict KPI in real-time on location while the previous version of the HF job plan is being implemented. This aspect of the disclosure utilizes raw time-series HF pumping data rather than pre-extracted or pre-engineered features to build the revised model. In addition, the model uses other information, such as location, reservoir, and completion parameters. Historical data from a large set of wells is fed into the model for training. Predictions can be made on-location in real-time for a proposed well location or a specific well of interest. The statistical methodology can use various conventional models, such as deep learning, random forest, gradient boost, and other machine learning or statistical methods.

The first step of the flow is to collect production data and then clean and process the data. This is similar to the process described in FIG. 3C, production data processing flow 303. The next step is shown in the time-series data processing flow 601. The time-series HF data source flow 610 can be raw time-series HF pumping data. This data can span minutes, hours, days, or other time intervals of pumping data available for jobs in the historical data set. The data can be cleaned and processed for quality control as shown in flow 612. The time-series data is collected from the beginning of the data set up to a time t. Time t can be a point of time in the historical data or the present time.

There can be a variable amount of data available across different sized jobs. A decision point, such as decision flow 614, can be made to determine whether a change in the sampling of the data would be beneficial to the process. If 'Yes', then the data can be down sampled or up sampled to a pre-determined sample density for the wells to be used, as shown in flow 618. If no sampling changes are needed or if the sampling changes have been completed, the time-series data can be shifted to account for differences between surface and bottom hole values, as shown in flow 620.

A decision point, such as decision flow 622, can be made to determine whether a scaling change of the data would be beneficial to the process. If 'Yes', then the process proceeds to scaling flow 624 where the data can be scaled, i.e., standardized or normalized, to a certain range based on the modeling method used. If no scaling changes are needed or if the scaling changes have been completed, the data can be output as shown in flow 626. The time-series data is presented as data up to a time t. The data can be used to predict KPI at a later point in time, such as t+1 or t+n, wherein is a selected time interval in the future. The time in the future can be labeled T, which leads to T>t.

FIG. 6B is an illustration of a diagram of an example non-temporal data processing flow 602. The modeling process can use specific information about a well that is not temporal, such as being fixed to the well, as shown in flow 630. For example, the location of the well. This flow may include data sourced and processed as in FIG. 3A, flow 301, or as engineered in FIG. 3B, flow 302. These additional non-temporal features can be processed separately, as shown in flow 632. The data can be formatted to be constant with the time-series data, as shown in flow 634. One aspect can utilize repeating the constant feature value across the length of the time-series data to maintain a constant time-series dataset. Another aspect can develop a multi-stage model where the features are separately provided to the next steps as input, as shown in output flow 636.

FIG. 6C is an illustration of a diagram of an example time-series predictive model flow 603. The data from the previous flows can be combined to make a single dataset. Production data can be collected as shown in flow 630a, the time-series data can be collected up to a time t, as shown in flow 630b, and the additional non-temporal data can be collected as shown in flow 630c. The combined dataset is shown in flow 632. The dataset can be divided into three separate classes or portions: (1) training data, (2) validation data, and (3) test data, as shown in flow 634. Training data can be used to build one or more models. Validation data can be used to evaluate the trained model and to assess different algorithms. The test data can be used as a blind dataset to check the model robustness and predictive power. The data portions can be created using a random partition selection or using a clustering algorithm based on specific features, such as location.

The data portions can then be used to develop models to predict well production or KPI output using statistical or machine learning techniques, such as deep learning, machine learning, Bayesian modeling, geospatial modeling, and other techniques, as shown in flow 634. Deep learning models can further utilize neural networks, such as convolutional neural networks, recurrent neural networks, other neural networks, or a combination of neural networks. In other aspects, the machine learning models can include random forest, gradient boost, decision trees, and other techniques. They can involve hierarchical and non-hierarchical techniques. The output can be a well production prediction at a specific time t+n, as shown in output flow 636.

Figure 6D:
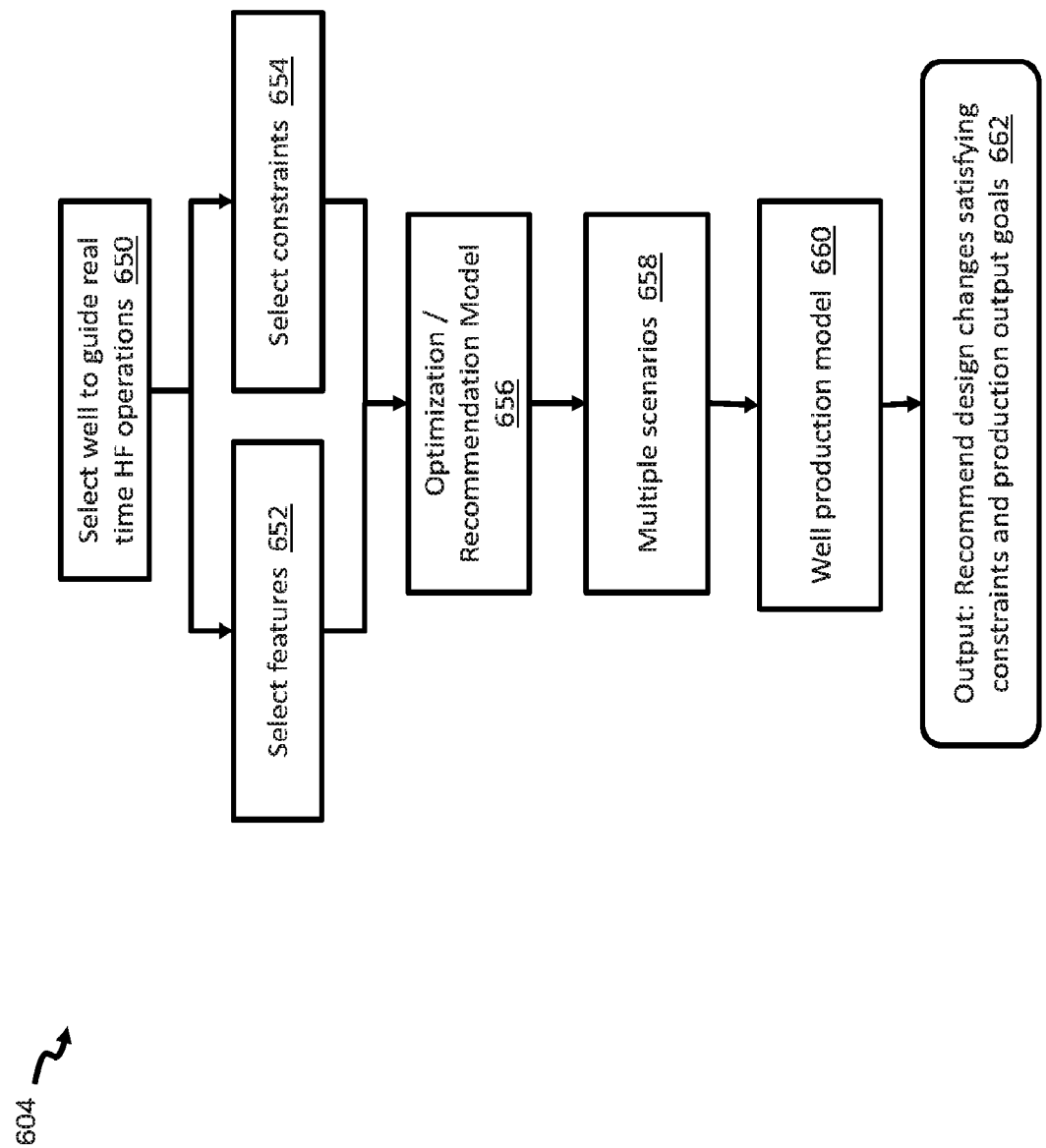
FIG. 6D is an illustration of a diagram of an example time-series HF job design flow.

FIG. 6D is an illustration of a diagram of an example time-series HF job design flow 604. A specific well, for which real-time job plan revisions are requested, can be selected, as shown in flow 650. A list of time-series features can be selected for optimization, as shown in flow 652. The features can be pre-defined or user selected. The pre-defined or custom constraints can be selected, as shown in flow 654.

The features from flow 652 and the constraints from flow 654 can be utilized in the optimization, i.e., recommendation, model generation, as shown in flow 656. The optimization algorithm, such as a genetic algorithm, pattern search, differential evolution, and other types, can be applied to the collection of selected features within the provided constraints to generate multiple iterations and scenarios to optimize the pre-defined KPI, as shown in flow 658. The process can then select the most optimized, or best fit, scenario given the constraints from a pool of top scenarios, to generate a predicted well production or other KPI at time t+n. This process can be represented by well production model flow 660, which can encapsulate the time-series predictive model flow 603. The output of the well production model flow 660 is the resultant of the output flow 636 of time-series predictive model flow 603.

The output can be a recommended job design revision that satisfies the constraints and KPIs, as shown in flow 662. For example, the model can recommend a change in proppant concentration from one treatment to another treatment based on the data collected on the location during the previous treatments. In some aspects, user input can be provided during the development phase of the model and the model can provide automated recommendations without further user input or feedback, once the process has been applied to the HF job plan.

FIG. 7 is an illustration of a flow diagram of an example time-series HF job design method 700. Method 700 demonstrates a way to adjust a HF job plan in real-time using treatment or stage data gathered from a well site. The changes can occur after a treatment or stage cycle is completed, or at another time point. Method 700 can build a model to assist in predicting what change to the HF job plan can move the HF job plan execution toward a better satisfaction of the identified KPIs.

Method 700 starts at a step 701 and proceeds to a step 705. In the step 705, the first data set is processed. The first data set is received, cleaned, and quality checks applied. For example, imputation can be used to fill in missing values and outlier data can be excluded from the first data set. The first data set is sourced from production values and data, reporting issues from one or more production wells, and one or more KPIs. Proceeding to a step 710, the time-series data set is received. The time-series data can be collected from HF pumping data from the well site and from historical data sources for the well site and nearby or similar well sites. The time-series data can be cleaned, processed, and have quality checks applied.

In a step 715, an optimized predictive model can be built. The predictive model can be built using a predictive data set including one or more elements of the first data set and one or more elements of the time-series data set. In a step 720, the HF job plan can be revised using the predictive model. Time-series data from the well site can be run through the predictive model to predict how the well site will react and produce over subsequent time intervals, such as treatment cycles. The method 700 ends at a step 750.

FIG. 8A is an illustration of a diagram of an example pressure response feature flow 800. FIG. 8B is an illustration of a diagram of an example flow distribution response feature flow 801. FIG. 8C is an illustration of a diagram of an example fracturing dimensions response feature flow 802. FIGS. 8A to 8C demonstrate various aspects of using response features as part of the time-series data feature selection within the models developed in FIGS. 6A to 6D. The response features can be used as part of a model input to identify response features that can serve as a proxy for well production or other KPI predicted output. A second model input can be generated to establish a relationship between response features and on-location controllable features, such as flow rate, proppant concentration, and other controllable features. The response features thus can be controlled by means of the controllable features thereby leading to better modeling decisions to maximize KPI, such as production output.

Flow distribution feature flow 801 follows a similar path as described for pressure response feature flow 800. In place of the pressure response features, the flow distribution features can be used throughout the description of the pressure response feature flow 800. In one aspect, the flow distribution features can be extracted from data gathered from fiber optics data, for example, a distributed acoustic sensing (DAS) system.

Fracturing dimensions flow 802 follows a similar path as described for pressure response feature flow 800 and flow distribution feature flow 801. In place of the pressure response features, the fracturing dimensions features can be used throughout the description of the pressure response feature flow 800. In one aspect, the fracturing dimensions features can be extracted from data gathered from offset well-monitored microseismic data, in-hole-monitored microseismic data, offset well pressure monitoring data (i.e., for fracture hits, such as from a pressure indication of communication between wells), offset well tiltmeter data, surface tiltmeter data, or physics-based modeling of pressure or net pressure response in real-time. In other aspects, other response features can be utilized in the algorithm.

In pressure response feature flow 800, flow 810 (and similar flows 830 and 850 for their respective response features) describes the extraction of pressure response features from time-series pumping data. The pressure response features can be identified from historic time-series pressure data or from real-time time-series pressure data. The features can be aggregated at different levels, for example over a treatment job, diversion cycle, pumping stage, or at a time interval, such as one second. The features can be extracted during the pumping operations or during a shutdown operation. An example feature for the pumping stage aspect can be first and second derivative of pressure with respect to time, non-linear spline fits of pressure responses, first, second, and third moment during pad phase, proppant pumping, diversion cycle properties, shape of entire treatments, and other types of features. During the shutdown operation, an example feature can be instantaneous shut-in pressure (ISIP), pressure decline slope post pumping, G-function (a dimensionless time function relating shut-in time to total pumping time) parameters, and water hammer amplitude, frequency, and decay. The features can be extracted using a statistical or machine learning method or can be based on SME engineering and domain knowledge. A combination of extraction techniques can also be used.

In the building of a model flow 812 (and similar flows 832 and 852 for their respective response features), the extracted pressure response features can be aggregated. The model can be built from the aggregated data using statistical or machine learning techniques that establish the relation of the pressure response features with the well production output. This can identify the statistically significant job response features. The pressure response features can then act as a proxy for the production output changes. Conventional machine learning models can be used to build the models, such as linear regression, regularization, ridge regression, lasso, support vector machine, random forest, gradient boosting, decision trees, and other types of algorithms.

In the determine optimal pressure response features flow 814 (and similar flows 834 and 854 for their respective response features), after the relevant response features are identified, the optimal combinations of the pressure response features can be determined. The goal is to determine the combination that will maximize the KPI.

In the build models using controllable features flow 816 (and similar flows 836 and 856 for their respective response features), the on-location features that can be modified during a job can be connected to the pressure responses. Conventional multivariate time-series forecasting models or machine learning or deep learning algorithms (such as recurrent neural network, long-short term memory (LSTM), and other models) can be used to build the models.

In the monitor pressure response features flow 818 (and similar flows 838 and 858 for their respective response features), the significant pressure response features identified in flows 812 and 814 can be extracted and monitored in real-time. A determination can be made whether the job response is favorable to the KPI, based on the analysis in model flow 812. If yes, then the job plan can continue as currently designed. If no, then one or more controllable features can be adjusted based on the models developed in controllable features flow 816 to attempt to cause the response features to move in a direction to improve the KPI results.

Multiple extracted response features can be combined in a flow. For example, pressure response and flow distribution response can be used in a single workflow, as input features to the model-building and subsequent steps. In another aspect of the method, flow distribution response and fracturing dimension response could be used together in a single workflow. In another aspect, pressure response and fracture dimension could be used together in a single workflow. In another aspect, pressure response, flow distribution response, and fracture dimension response could be used together in a single workflow.

Figure 9:
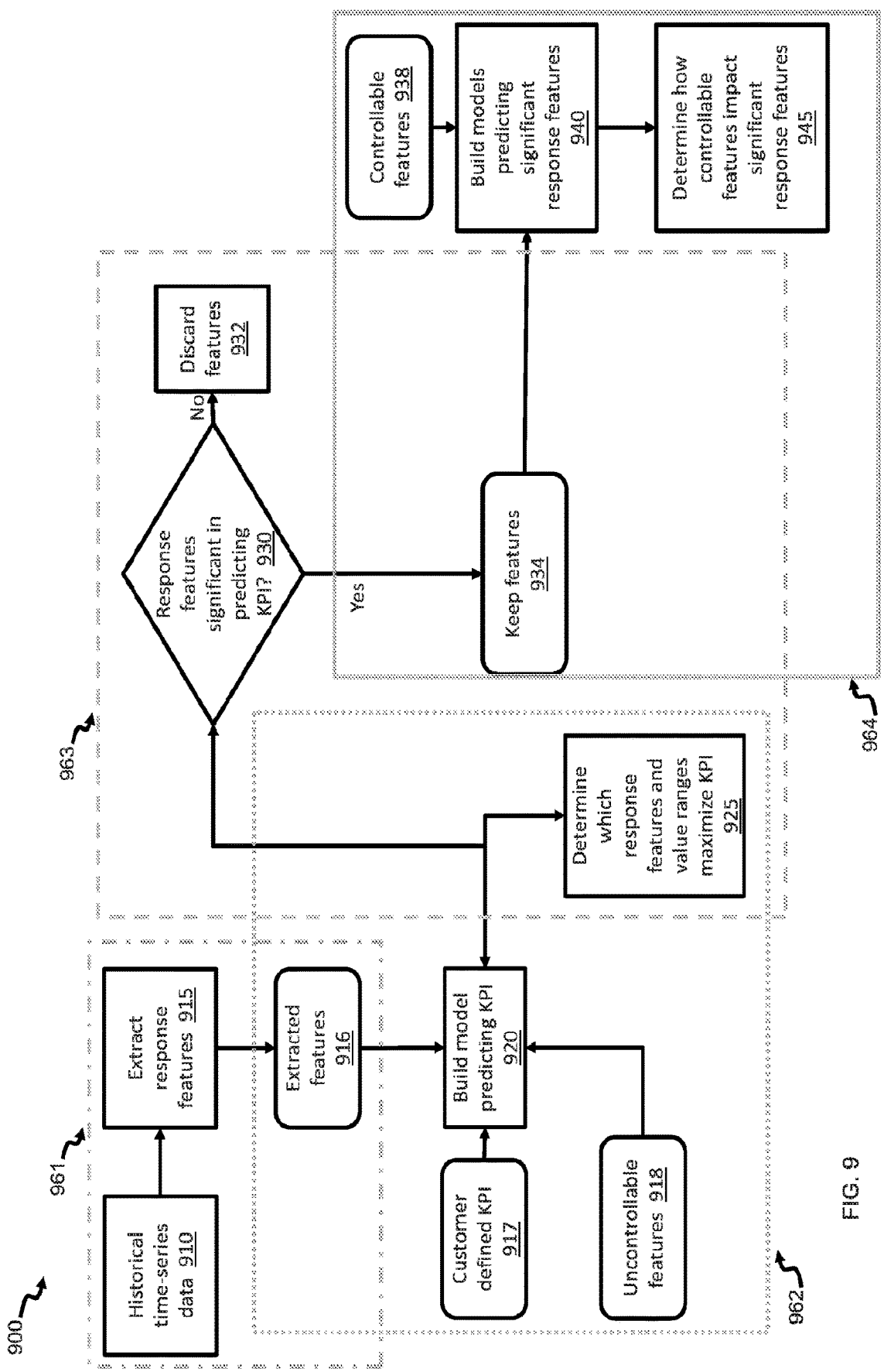
FIG. 9 is an illustration of a diagram of an example general response feature flow.

FIG. 9 is an illustration of a diagram of an example general response feature flow 900. General response feature flow 900 is another view demonstrating an example flow for this aspect of the disclosure and is divided into sections, approximating the flows 800, 801, and 802 described in FIGS. 8A to 8C. The general response feature flow 900 begins with flow 910 where the historical time-series data is identified that is relevant for the well site job plan. The appropriate response features are extracted in flow 915. The response features dataset is shown by flow 916. Flows 910, 915, and 916 are outlined by dash-dot box 961. Dash-dot box 961 represents the flows 810, 830, and 850 in FIGS. 8A to 8C respectively.

A model to predict the KPI is built in model building flow 920. It uses customer defined KPI parameters, as shown by flow 917. Model building flow 920 also uses uncontrollable features, as shown in flow 918. As part of the model building flow 920, a determination of which response features and their respective value ranges can better match the KPIs is made, as shown in flow 925. Flows 917, 918, 920, and 925 are boxed by dotted box 962. Dotted box 962 represents the model flows 812, 832, and 852 in FIGS. 8A to 8C respectively.

An evaluation can be made to determine whether the response features selected are significant in predicting the KPI parameters, as shown in decision flow 930. Should the resultant of decision flow 930 be 'No', then the response features can be discarded, as shown in flow 932. If the decision flow 930 is 'Yes', the response features are kept and used in further analysis and processing, as shown in flow 934. Flows 925, 930, 932, and 934 are boxed by a dashed line 963. Dashed line 963 represents the flows 814, 834, and 854 in FIGS. 8A to 8C respectively.

New models can be built to predict the significant response feature changes due to the controllable features, as shown in flow 940. The controllable features can be provided to flow 940, as shown in flow 938. A determination of how the controllable features impact the response features can be made based on the predictive model, as shown in flow 945. Flows 934, 938, 940, and 945 are boxed by a light gray line 964. Light gray line 964 represents the controllable feature flows 816, 836, and 856 in FIGS. 8A to 8C respectively.

Figure 10:
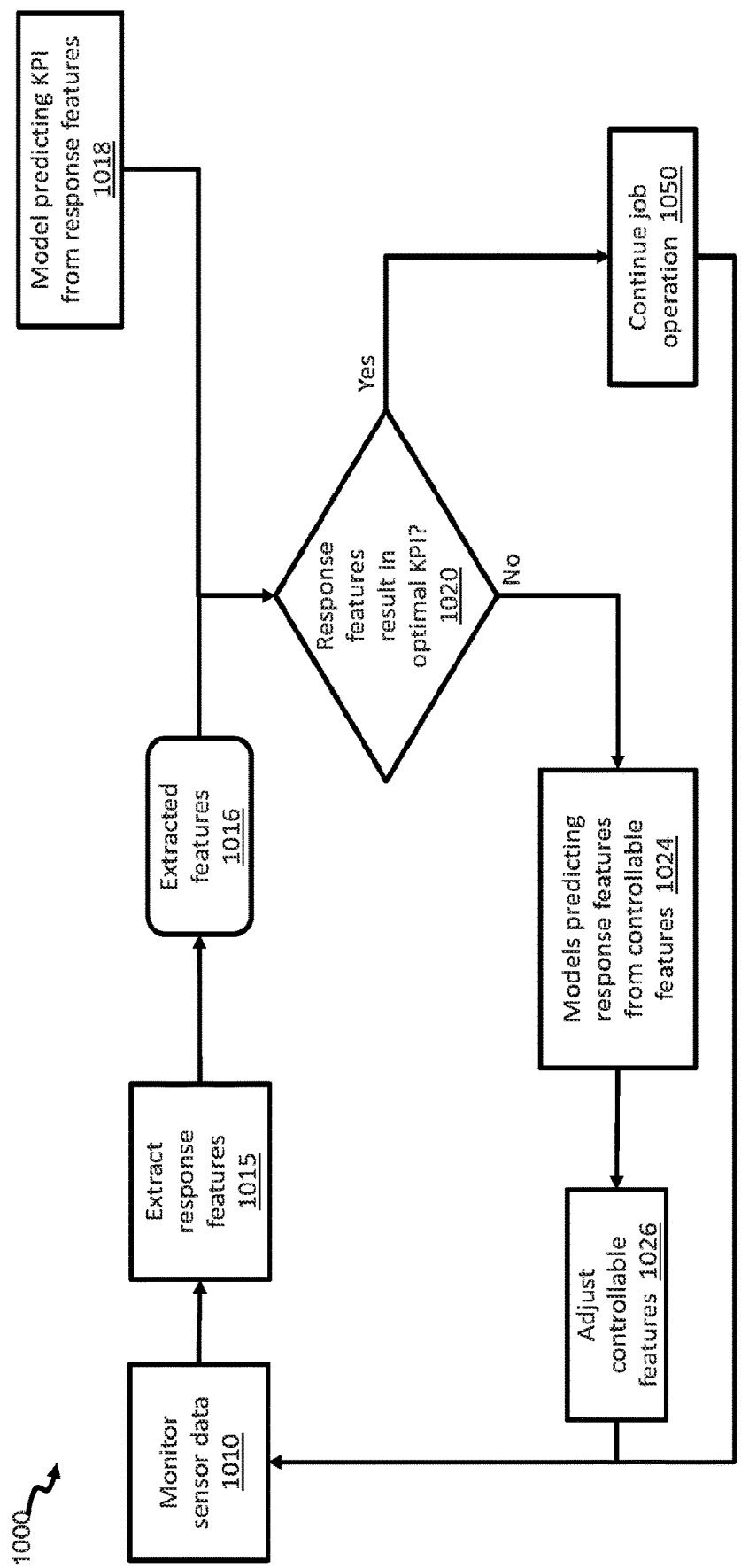
FIG. 10 is an illustration of a diagram of an example job design adjustment flow.

FIG. 10 is an illustration of a diagram of an example job design adjustment flow 1000. Job design adjustment flow 1000 can be a real-time adjustment process for the job design parameters. Job design adjustment flow 1000 represents the flows 818, 838, and 858 in FIGS. 8A to 8C respectively. The model or models developed to predict the KPI from response features, from the flows described in FIG. 9, are retrieved for this process, as shown in flow 1018.

The flow process for the remaining flows form a partial loop mechanism where continuous monitoring, feedback, and adjustment is made to the HF job plan. Flow 1010 monitors the received data, such as from sensors in and near the well site system. The respective response features can be extracted from the received data, as shown in flow 1015. The new data set of extracted response features is shown by dataset flow 1016. The dataset flow 1016 is used as inputs to the model received from flow 1018.

A determination is made whether the response features are likely to have results favorable with respect to the KPIs, as shown in decision flow 1020. If the resultant from decision flow 1020 is 'Yes', then the HF job plan continues execution as designed, as shown in flow 1050. If the resultant from decision flow 1020 is 'No', then the models predicting response features from controllable features is activated, as shown by flow 1024. One or more of the controllable features are adjusted, per the model predictions, as shown in flow 1026. The flow process from flow 1026 and from flow 1050 returns to flow 1010 for additional monitoring at the next time interval.

Figure 11:
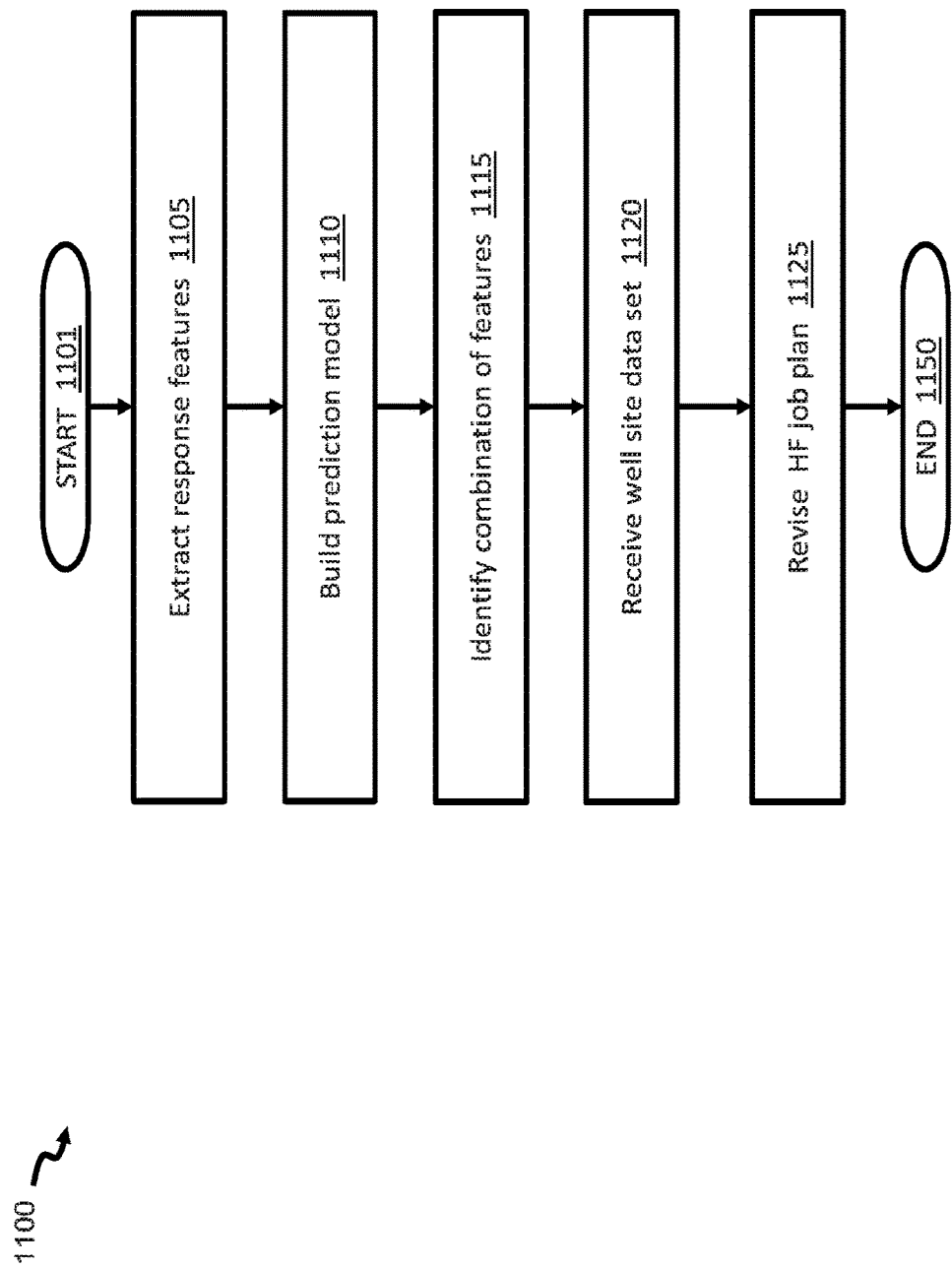
FIG. 11 is an illustration of a flow diagram of an example response feature method.

FIG. 11 is an illustration of a flow diagram of an example response feature method 1100. Method 1100 demonstrates a way to utilize extracted response features in conjunction with a prediction model. Response features can be received in real-time from a well site. Those response features can be run through as input into the prediction model. One or more features can be adjusted as input into the prediction model. The prediction model can output a recommendation on HF job plan changes in real-time to one or more features that can improve the well state with respect to the KPIs.

Method 1100 starts at a step 1101 and proceeds to a step 1105. In the step 1105, response features, such as pressure responses, flow distributions, and fracture dimensions, can be received. The response features can be gathered during pumping operations or during shutdown operations. In a step 1110, a prediction model can be built. The prediction model can use the response features as input. The prediction model can produce one or more scenarios so that as the response features are periodically updated, the predictions on the impact to the KPIs can be identified. Proceeding to a step 1115, a combination of features can be identified that could impact the KPIs. The features can be evaluated by how impactful they are to the KPIs. The features that are the most impactful can be identified and selected. The number of features can vary from one to the number of features gathered.

Proceeding to a step 1120, well site data from one or more treatment cycles can be received. In a step 1125 the HF job plan can be revised. The revision process can utilize the well site data and the prediction model. The revision process can keep the HF job plan as currently designed should the prediction model indicate, using the extracted response features, that the KPIs can be satisfied. If the KPIs may not be satisfied or could be improved upon, the revision process can select the features to adjust, based on the prediction model's output and extracted response features. The method 1100 ends at a step 1150.

Figure 12A:
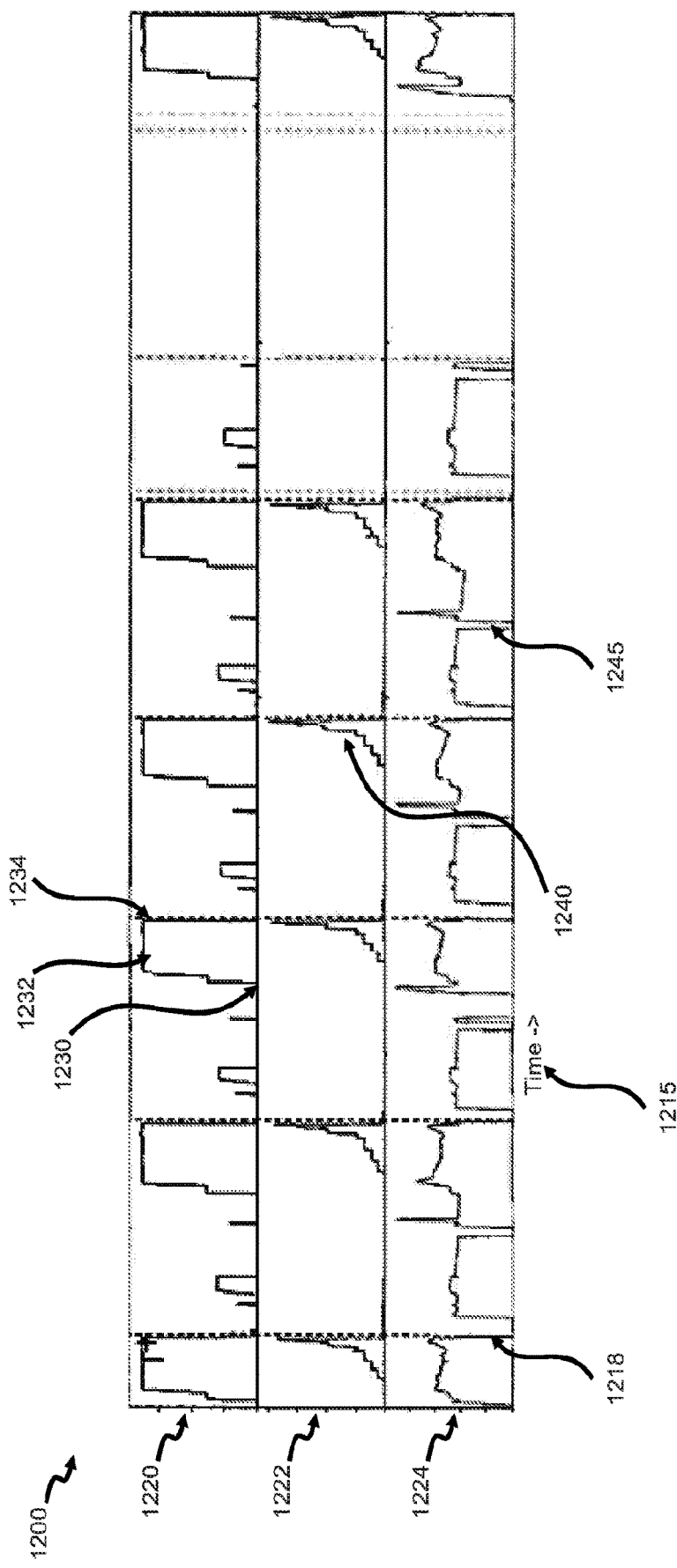
FIG. 12A is an illustration of a diagram of an example graph demonstrating a selection of treatment and cycle start and end time points.
Figure 13:
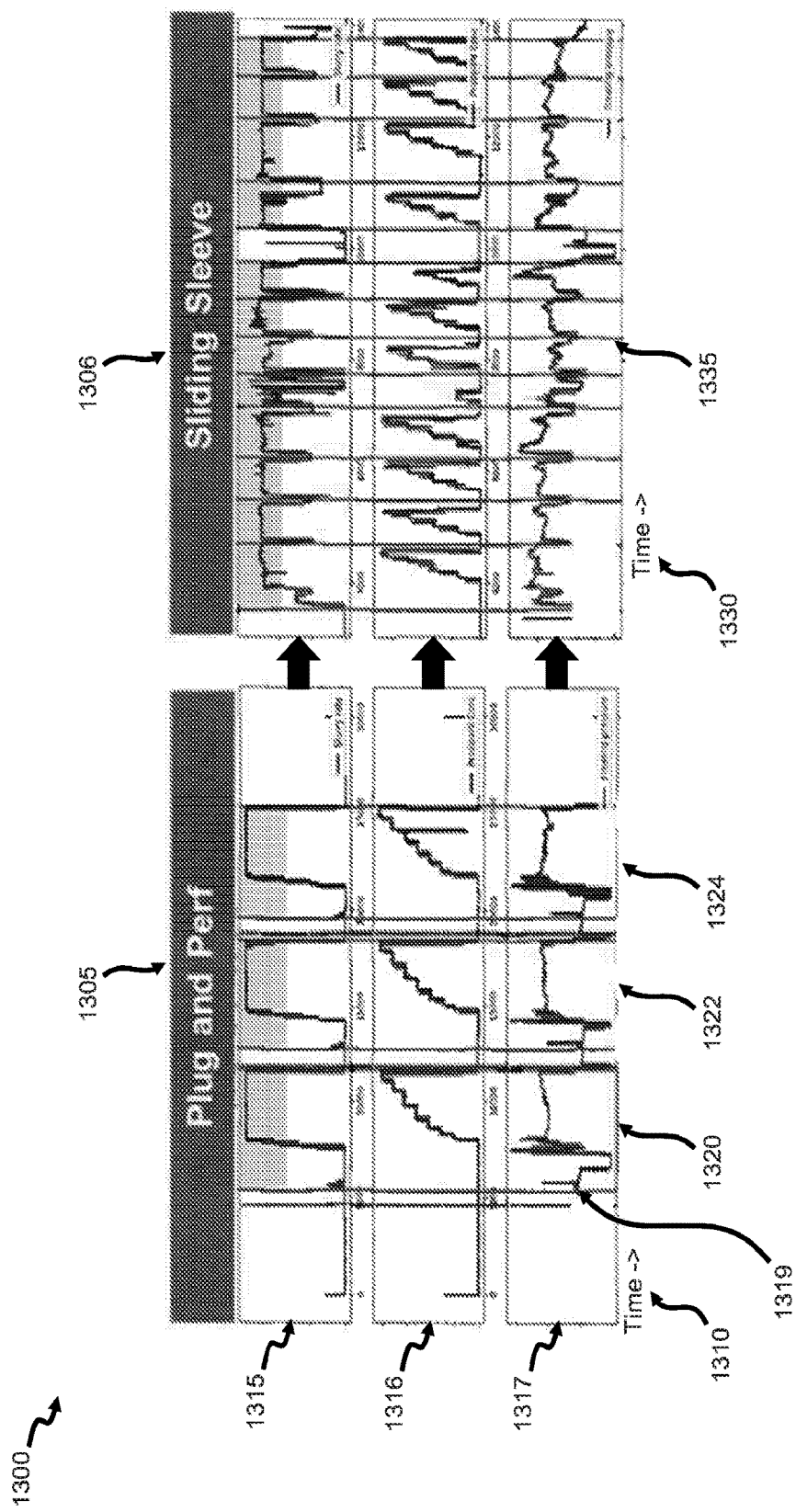
FIG. 13 is an illustration of a diagram of an example graph demonstrating a machine learning selection of treatment cycles.

FIG. 12A is an illustration of a diagram of an example graph 1200 demonstrating a selection of treatment and cycle start and end time points. A machine learning approach can be used to detect the presence or absence of an event, and the start and end of that event. In some aspects, the event properties can also be identified. An event can be a treatment, diversion cycle, sand slug, minifrac, rate step up sequence, rate step down sequence, initial shut-in pressure (ISIP), formation breakdown, screenout from time-series pumping data, and other event types. The pumping data can be treating pressure, slurry rate, proppant concentration, and other pumping data, along with available user defined data elements. The treatment and cycle information can be utilized by one or more of the time-series models described above, and provide additional analysis to the model generation flows.

Graph 1200 demonstrates a graph with three sections. Graph 1200 has an x-axis 1215 of time, which increases to the right. The three graph sections include the slurry rate 1220, the proppant concentration 1222, and the treatment pressure 1224. Graph 1200 has multiple vertical dashed lines, one of which is labeled as line 1218. Lines 1218 indicate the separation of each treatment cycle in the graph 1200.

Each treatment cycle includes a line graph indicating how each of the tracked data elements in each section correlate with the treatment cycle implementation. The slurry rate 1220 indicates a start of a detected event at point 1230. A maximum event response is shown by point 1232. The end of the event is indicated by point 1234. The proppant concentration 1222 demonstrates the same event data collection, shown by line graph portion 1240. The treatment pressure 1224 demonstrates the same event data collection, shown by line graph portion 1245.

A SME or an automated process can analyze the collected data, as shown in the graph 1200 to determine how the events correlate to the various treatment cycles. The information computed from this analysis can be used as input to the modeling phase of this aspect.

Figure 12B:
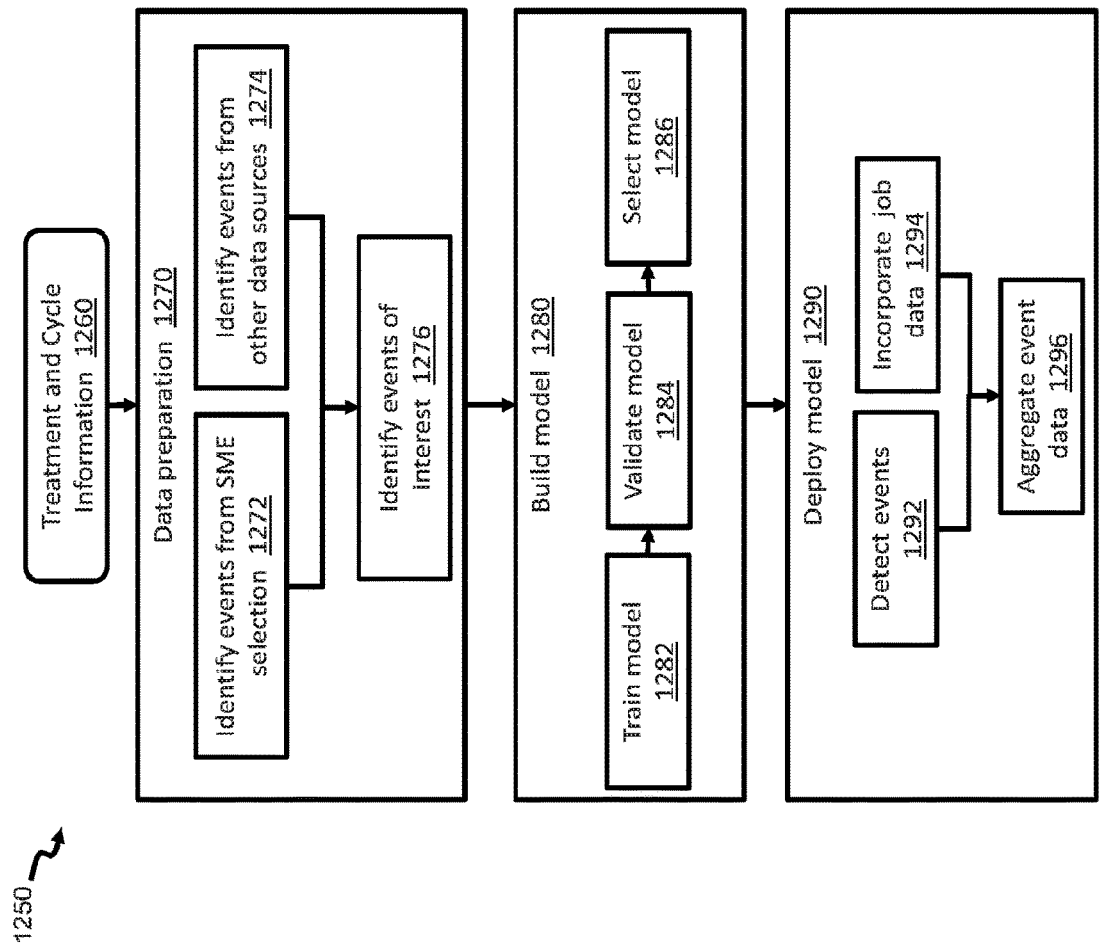
FIG. 12B is an illustration of a block flow diagram of an example treatment and cycle process flow.

FIG. 12B is an illustration of a block flow diagram of an example treatment and cycle flow 1250. The treatment and cycle information 1260 can include three or more flows. For example, the treatment and cycle flow 1250 can have a data preparation flow 1270. Treatment and cycle information 1260 can be provided to data preparation flow 1270. The data preparation flow 1270 can identify events from a SME selection, as shown in flow 1272 or from other data sources, as shown in flow 1274. Next, events of interest can be identified, as shown in flow 1276, such as beginning and ending of treatments, which can be utilized to create a labeled dataset for training, validation, and test data for an event detection machine learning approach.

Following the data preparation flow 1270 can be a build model flow 1280 to automatically detect and identify such events. Using a subset of the data prepared in the data preparation flow 1270, one or more machine learning models can be trained, as shown in flow 1282. The models can then be validated against additionally collected data, as shown in flow 1284. Models can include deep learning, logistic regression, support vector machine, random forest, Bayesian, neural network, gradient boost, and other model algorithms. A model can be selected, as shown in flow 1286, based on the model that provides the results that best match the validation dataset, optimization capability and performance, ability to apply real world physical and operational constraints, ease of deployment, and other factors.

Following the build model flow 1280 can be a deployment of the selected model 1290. Events can be detected in unlabeled data using the model selected from the build model flow 1280, as shown in flow 1292. The model can incorporate available job data, as shown in flow 1294. Next, the deployment of the selected model 1290 can aggregate the resulting event types, times, and attributes in the data for further use, as shown in flow 1296.

FIG. 13 is an illustration of a diagram of an example graph 1300 demonstrating a machine learning selection of treatment cycles. Graph 1300 includes two portions, a graph 1305 demonstrating event data collected from a plug and perforate completion (plug-n-perf) sequence, and a graph 1306 demonstrating event data collected from a sliding sleeve completion sequence. Graph 1300 has an x-axis 1310 and 1330 of time, which increases to the right. Graphs 1305 and 1306 demonstrate graphs with three sections. The three sections include the slurry rate 1315, the proppant concentration 1316, and the treatment pressure 1317. Graph 1300 has multiple vertical lines, one of which is labeled as line 1319 on graph 1305, and line 1335 on graph 1306. Lines 1319 and lines 1335 indicate the separation of each treatment cycle in the graph 1300.

Example treatment cycles are labeled as treatment cycle 1320, treatment cycle 1322, and treatment cycle 1324 on graph 1305. Each treatment cycle includes a line graph indicating how each of the tracked data elements in each section correlate with the treatment cycle implementation. Similar to graph 1200, graph 1300 indicates how each of the events correlate to the treatment cycle implementation.

A SME or an automated process can analyze the collected data, as shown in the graphs 1200 and 1300, to determine how the events correlate to the various treatment cycles.

Figure 14:
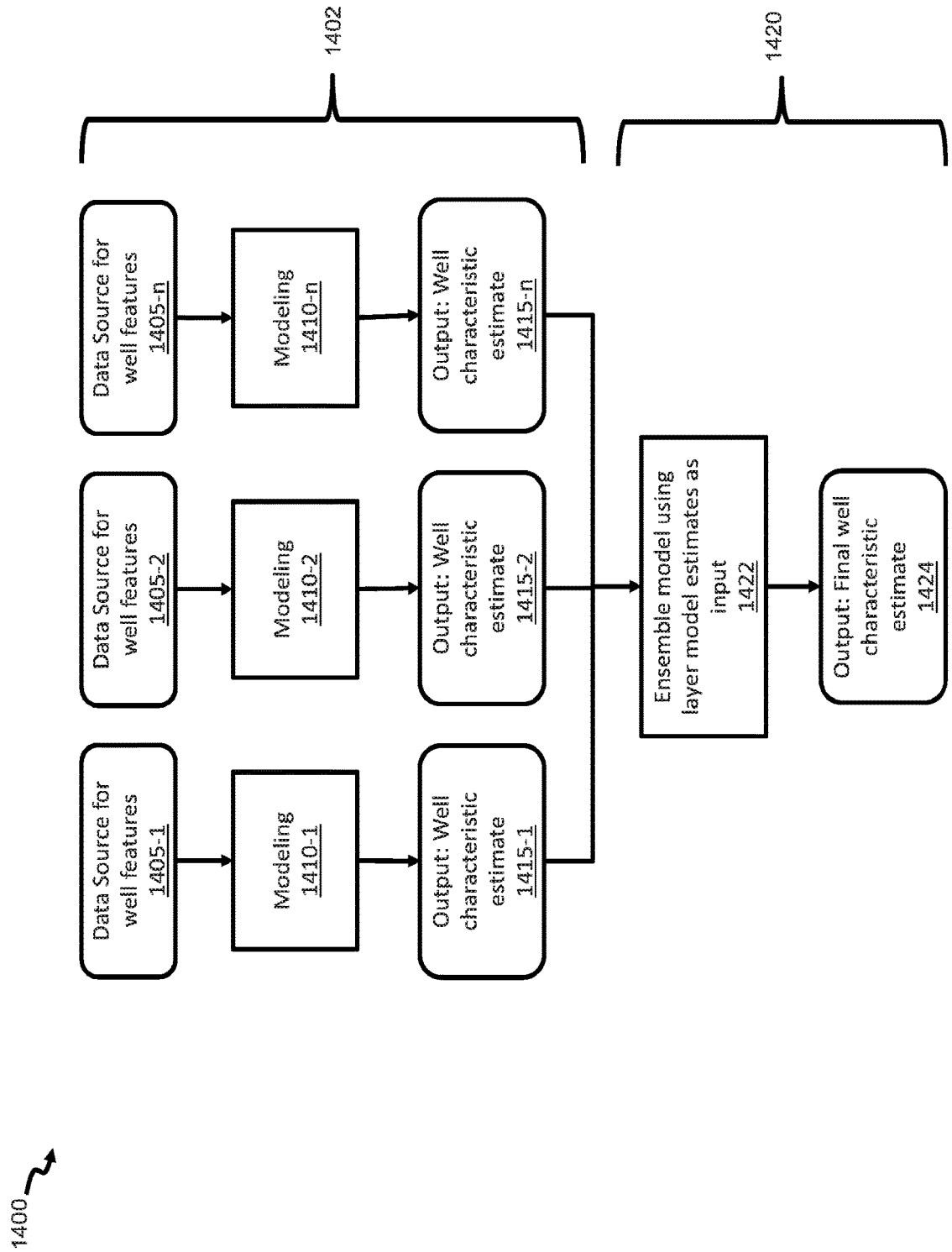
FIG. 14 is an illustration of a diagram of an example ensemble model flow with independent data sources.
Figure 15:
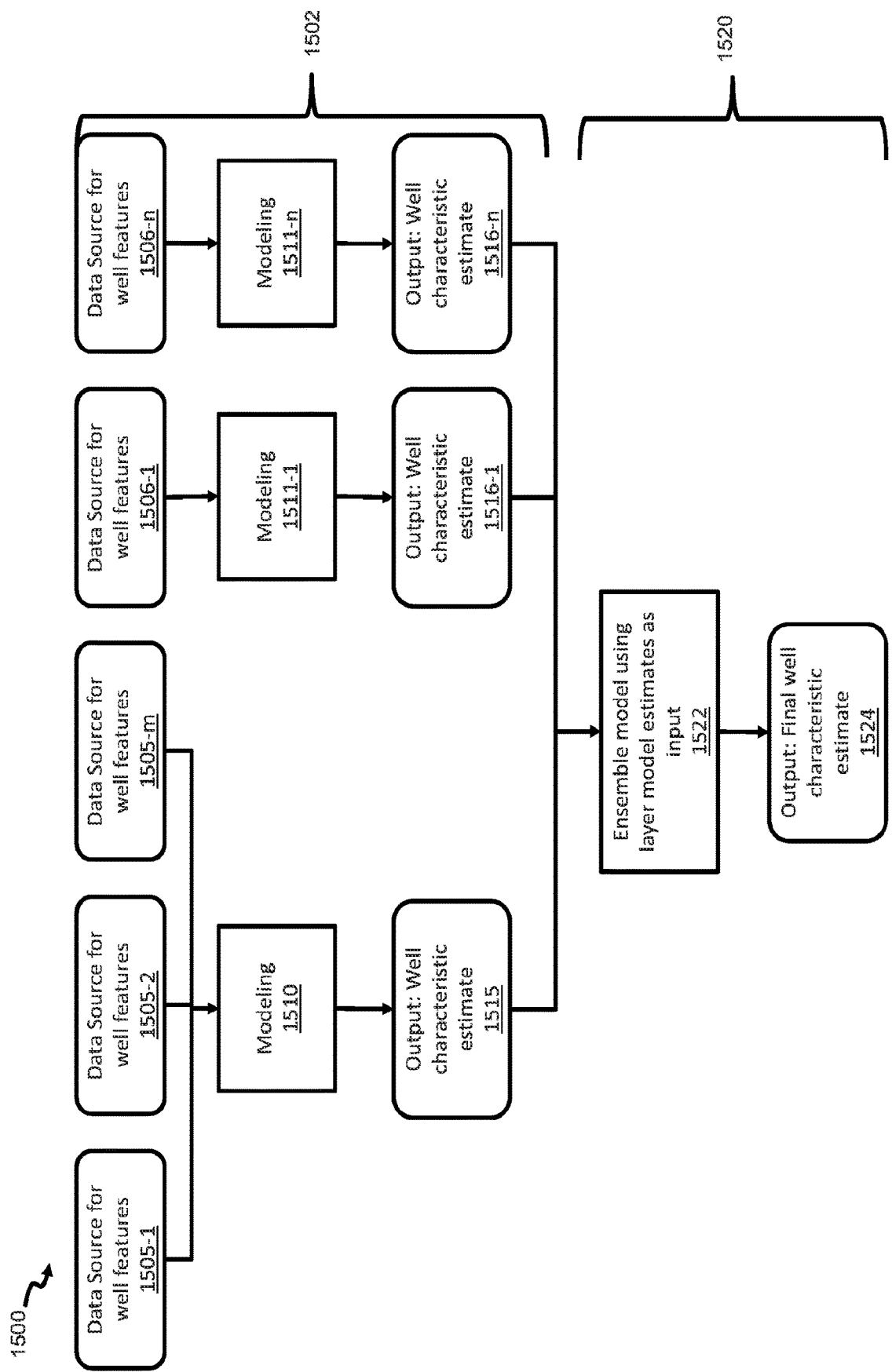
FIG. 15 is an illustration of a diagram of an example ensemble model flow with independent and combined data sources.
Figure 16:
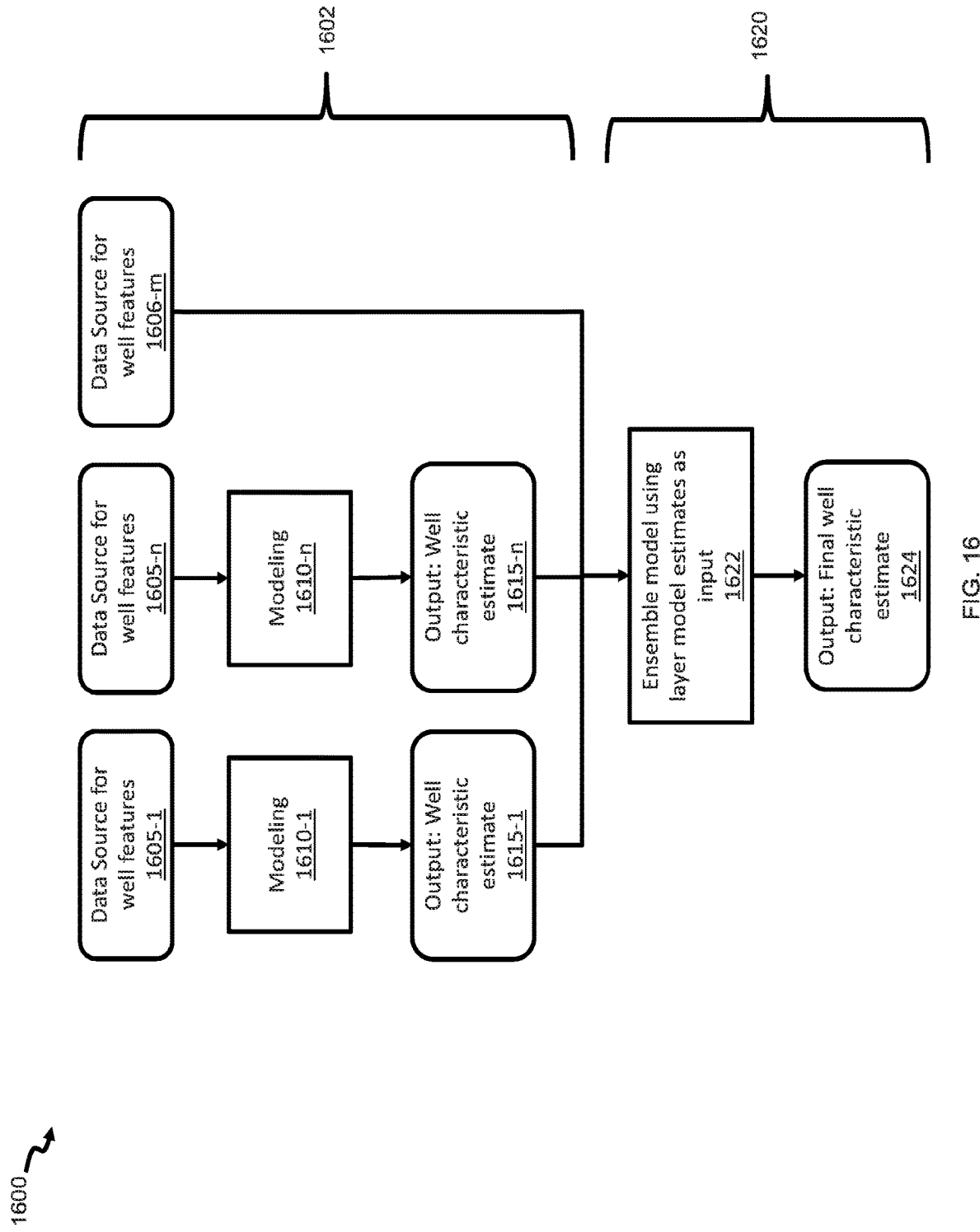
FIG. 16 is an illustration of a diagram of an example ensemble model flow with independent data sources and data sources as direct input into the ensemble model.
Figure 17:
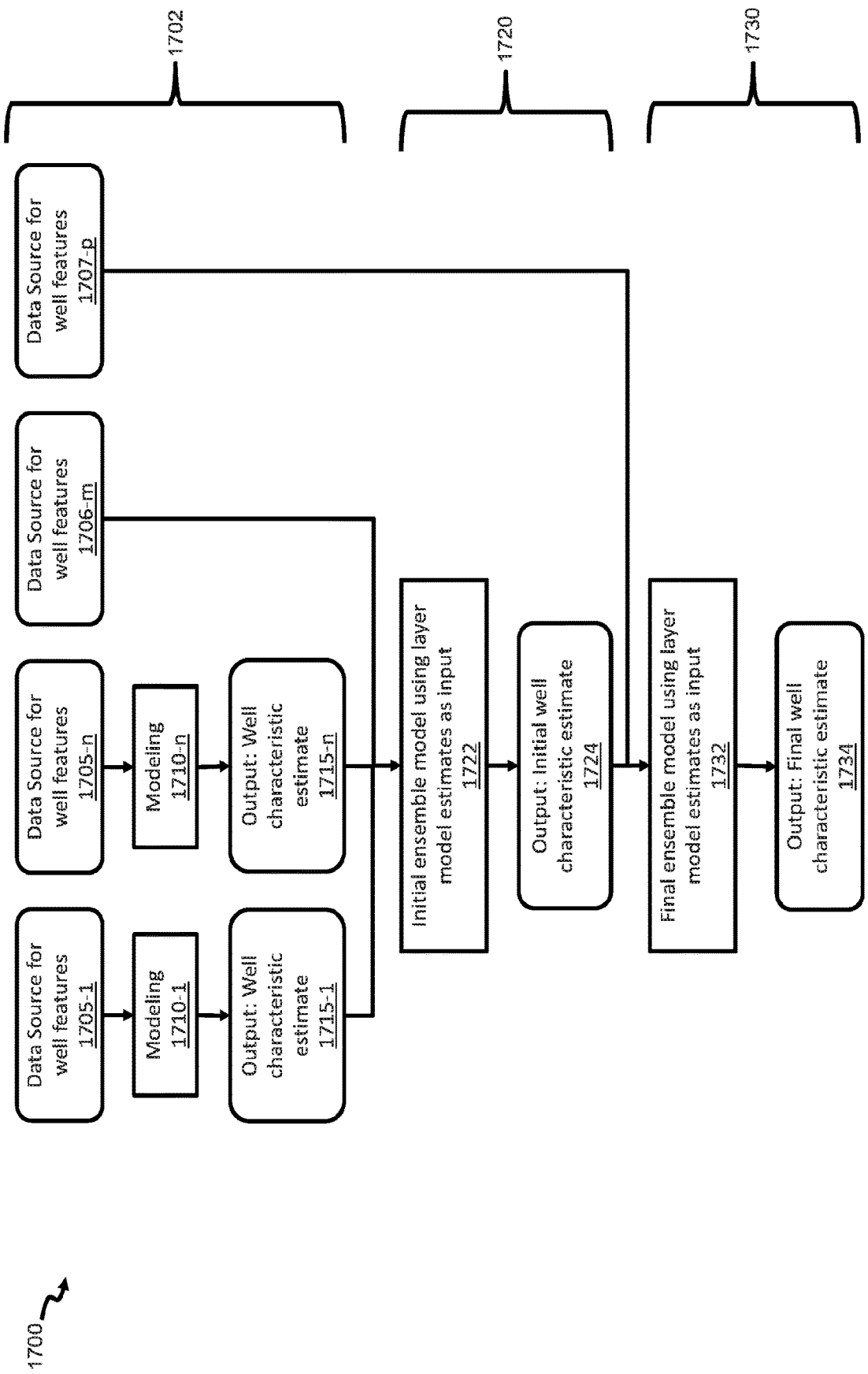
FIG. 17 is an illustration of a diagram of an example ensemble model flow with a two-step ensemble model.

FIG. 14 is an illustration of a diagram of an example ensemble model flow 1400 with independent data sources. FIG. 15 is an illustration of a diagram of an example ensemble model flow 1500 with independent and combined data sources. FIG. 16 is an illustration of a diagram of an example ensemble model flow 1600 with independent data sources and data sources as direct input into the ensemble model. FIG. 17 is an illustration of a diagram of an example ensemble model flow 1700 with a two-step ensemble model. FIG. 18 is an illustration of a diagram of an example ensemble model flow 1800 with independent and combined data sources, and a two-step ensemble model.

Ensemble model flows 1400, 1500, 1600, 1700, and 1800 can represent one or more ensemble modeling aspects of this disclosure. Ensemble modeling can be utilized to support the flows previously described herein, utilized in any flow step wherein a predictive or analysis model is described. The ensemble modeling technique can be used to estimate or predict a well characteristic, for example, well production output or other KPI, completion efficiency, geospatial location, completion parameters, stimulation parameters, reservoir data, well logs, well directional surveys, drilling parameters, production data, fracture topology, fluid flow and dynamics, DAS, distributed temperature sensing (DTS) data, well header information, and other characteristics.

The ensemble model can consolidate a suite of modeling techniques and data sources, such as physics-based methods, numerical estimation methods, mathematical, statistical methods, earth models, geospatial, geological, reservoir-based models, data driven machine learning models, and other modeling techniques. Data sources can include information and parameters describing well characteristics. The ensemble modeling can combine some or all of the well characteristic information and data sources in a systematic and scalable method. The ensemble modeling can be a mathematical or data driven statistical model, a weighted average, linear combination, a non-linear model, Bayesian hierarchical model, and other model types. The estimates from each of the models generated can vary and they may not converge towards the true value for the feature being examined. In addition, the data sources can share common underlying data. It can be beneficial to utilize the ensemble modeling techniques to combine the estimates from two or more models to obtain a single estimate that is reflective of the various models and data sources.

FIG. 14 ensemble model flow 1400 can build individual models for each of the data sources, parameters, and assumptions to obtain an estimate of well characteristics. The individual models can be incorporated together using a second stage modeling to obtain a combined estimate. The second stage modeling can develop a model that uses individual estimates as input parameters, and then build a new model to generate a single combined estimate. The second stage model can also be a weighted average, linear regression, or non-linear regression combination of the individual estimates. The second stage model can also be a Bayesian hierarchical graphical model where the individual estimates are nodes in the graph and the edges define relationships across different estimates or data sources.

There can be one or more data sources 1405, such as n number of data sources. These are labeled as data sources 1405-1 through 1405-*n*. The data sources can be public data sources, confidential data sources, proprietary data sources, and other data sources. The data sources can include well characteristics, i.e., features. Well characteristics can include data and information about the wellbore, reservoir, and treatment. Each data source 1405 can have a respective modeling flow 1410. There can be n number of modeling flows 1410, matching the number of data sources 1405. The output from each respective modeling flow 1410 is an output 1415 of well characteristic estimates. There can be n number of outputs 1415, matching the number of data sources 1405. Data sources 1405, modeling flows 1410, and outputs 1415 can be grouped together to form an individual model layer step 1402.

The collected outputs 1415 can be used as inputs into an ensemble modeling flow 1422. The output 1424 of the ensemble modeling flow 1422 can be a set of final well characteristic estimates. The ensemble modeling flow 1422 and the output 1424 can be grouped together to form the ensemble model step 1420.

FIG. 15 ensemble model flow 1500 can be a variation of ensemble model flow 1400 where the first step can include building a model or a combination of models on a subset of data sources or parameters. The resulting output well characteristic estimates can be combined using an ensemble approach. The remaining parameters and data sources can be included with the combined estimate from the first step. This aspect can be applied to sources, methods, and parameters where certain specific relationships should be taken care of prior to combining with the other independent sources.

There can be two or more data sources 1505, such as m number of data sources. These are labeled as data sources 1505-1, 1505-2, through 1505-m. As in ensemble model flow 1400, the data sources can be of various types and sourced from various data repositories. Each of the data sources 1505 are used as inputs into a modeling flow 1510. The output from the modeling flow 1510 is an output 1515 of well characteristic estimates.

In addition, there can be one or more data sources 1506, such as n number of data sources. These are labeled as data sources 1506-1 through 1506-n. The data sources, as previously described, can be of various types of data sources. Each data source 1506 can have a respective modeling flow 1511. There can be n number of modeling flows 1511, matching the number of data sources 1506. The output from each respective modeling flow 1511 is an output 1516 of well characteristic estimates. There can be n number of outputs 1516, matching the number of data sources 1506. Data sources 1505 and 1506, modeling flows 1510 and 1511, and outputs 1515 and 1516 can be grouped together to form an individual model layer step 1502.

The collected outputs 1515 and 1516 can be used as inputs into an ensemble modeling flow 1522. The output 1524 of the ensemble modeling flow 1522 can be a set of final well characteristic estimates. The ensemble modeling flow 1522 and the output 1524 can be grouped together to form the ensemble model step 1520.

FIG. 16 ensemble model flow 1600 can be an ensemble model where individual models can be built on a subset of data sources and parameters, and the estimates from the individual models can serve as input to the second layer model in addition to the other data sources and parameters as direct input. The model can then estimate from the first step, and raw parameters from the other data sources can be used as inputs into the second layer model to estimate the well characteristics.

There can be one or more data sources 1605, such as n number of data sources. These are labeled as data sources 1605-1 through 1605-n. The data sources, as previously described, can be of various types of data sources. Each data source 1605 can have a respective modeling flow 1610. There can be n number of modeling flows 1610, matching the number of data sources 1605. The output from each respective modeling flow 1610 can be an output 1615 of well characteristic estimates. There can be n number of outputs 1615, matching the number of data sources 1605.

In addition, there can be one or more data sources 1606-m. There can be m number of additional data sources. Data sources 1605 and 1606, modeling flows 1610, and outputs 1615 can be grouped together to form an individual model layer step 1602.

The collected outputs 1615 and the data sources 1606 can be used as inputs into an ensemble modeling flow 1622. The output 1624 of the ensemble modeling flow 1622 can be a set of final well characteristic estimates. The ensemble modeling flow 1622 and the output 1624 can be grouped together to form the ensemble model step 1620.

FIG. 17 ensemble model flow 1700 extends the previously described ensemble model flows 1400, 1500, and 1600, by demonstrating that the two-layer model can be extended to multiple layer models encompassing various options, parameter combinations, and data or model relationships. Ensemble models can be built at different layers and then combined at the next layer using another ensemble model.

There can be one or more data sources 1705, such as n number of data sources. These are labeled as data sources 1705-1 through 1705-n. The data sources, as previously described, can be of various types of data sources. Each data source 1705 can have a respective modeling flow 1710. There can be n number of modeling flows 1710, matching the number of data sources 1705. The output from each respective modeling flow 1710 can be an output 1715 of well characteristic estimates. There can ben number of outputs 1715, matching the number of data sources 1705.

In addition, there can be one or more data sources 1706-m. There can be m number of additional data sources. Also, there can be one or more data sources 1707-p. There can be p number of additional data sources. Data sources 1705, 1706, and 1707, modeling flows 1710, and outputs 1715 can be grouped together to form a first individual model layer step 1702. The collected outputs 1715 and the data sources 1706 can be used as inputs into a first ensemble modeling flow 1722. The output 1724 of the first ensemble modeling flow 1722 can be a set of initial well characteristic estimates. The first ensemble modeling flow 1722 and the output 1724 can be grouped together to form the first ensemble model step 1720.

The output 1724 and the data sources 1707 can be used as inputs into a second ensemble modeling flow 1732. The output 1734 of the second ensemble modeling flow 1732 can be a set of final well characteristic estimates. The second ensemble modeling flow 1732 and the output 1734 can be grouped together to form the second ensemble model step 1730.

FIG. 18 ensemble model flow 1800 is a variation of ensemble model flow 1700 by demonstrating a variation of the multi-stage ensemble modeling. There can be two or more data sources 1805, such as m number of data sources. These are labeled as data sources 1805-1, 1805-2, through 1805-m. As in ensemble model flow 1400, the data sources can be of various types and sourced from various data repositories. Each of the data sources 1805 are used as inputs into a modeling flow 1810. The output from the modeling flow 1810 is an output 1815 of well characteristic estimates.

In addition, there can be one or more data sources 1806, such as n number of data sources. These are labeled as data sources 1806-1 through 1806-n. The data sources, as previously described, can be of various types of data sources. Each data source 1806 can have a respective modeling flow 1811. There can be n number of modeling flows 1811, matching the number of data sources 1806. The output from each respective modeling flow 1811 is an output 1816 of well characteristic estimates. There can be n number of outputs 1816, matching the number of data sources 1806. Data sources 1805 and 1806, modeling flows 1810 and 1811, and outputs 1815 and 1816 can be grouped together to form an individual model layer step 1802.

The collected outputs 1816 can be used as inputs into a first ensemble modeling flow 1822. The output 1824 of the first ensemble modeling flow 1822 can be a set of initial well characteristic estimates. The first ensemble modeling flow 1822 and the output 1824 can be grouped together to form the first ensemble model step 1820.

The collected outputs 1815 (from the modeling flows 1810) and the outputs 1824 (from the ensemble model flow 1822) can be used as inputs into a second ensemble modeling flow 1832. The output 1834 of the second ensemble modeling flow 1832 can be a set of final well characteristic estimates. The second ensemble modeling flow 1832 and the output 1834 can be grouped together to form the second ensemble model step 1830.

Ensemble model flows 1400, 1500, 1600, 1700, and 1800 demonstrate some of the variations possible with this aspect of the disclosure. Additional variations are possible, such as increasing the number of layers, where each layer builds an ensemble model while joining additional data sources and analysis.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

It is noted that as used herein and in the appended claims, the singular forms "a", "an", and "the" include plural referents unless the context clearly dictates otherwise.

Aspects disclosed herein include:

A. A method to design a final hydraulic fracturing (HF) job plan for directing operations of well site equipment for a well, including: (1) preparing a first data set, wherein the first data set is statistically processed, and wherein the first data set is processed to join disparate data elements sourced from different data sources, (2) engineering features utilizing the first data set, and wherein the engineering features comprises identifying standard and engineered features, (3) processing a final second data set, wherein the final second data set is computed from a preliminary second data set comprising estimated production values, reporting issues of a production well, and a key performance indicator (KPI), (4) selecting design parameters from the final second data set and the features, wherein the design parameters represent a reduction of a number of the features, (5) building a model, wherein the model is one or more of a final geospatial model, and a final predictive model, wherein the final geospatial model utilizes a geospatial data set comprising one or more of the first data set, the features, the final second data set, and the design parameters, and wherein the final geospatial model substantially isolates one or more of the design parameters, including a location of the well and stimulation of the well, and the final predictive model utilizes a predictive data set comprising one or more of the first data set, the features, the final second data set, and the design parameters, and (6) designing the final HF job plan, utilizing the final geospatial model and the final predictive model.

B. A computer program product having a series of operating instructions stored on a non-transitory computer-readable medium that directs a data processing apparatus when executed thereby to perform operations to design a hydraulic fracturing (HF) job plan to direct operations of well site equipment of a well, having operations including: (1) preparing a first data set, wherein the first data set is statistically processed, and wherein the first data set is processed to join disparate data elements sourced from different data sources, (2) engineering features utilizing the first data set, and wherein the engineering features comprises identifying standard and engineered features, (3) processing a final second data set, wherein the final second data set is computed from a preliminary second data set comprising estimated production values, reporting issues of a production well, and a key performance indicator (KPI), (4) selecting design parameters from the final second data set and the features, wherein the design parameters represent a reduction of a number of the features, (5) building a model, wherein the model is one or more of a final geospatial model, and a final predictive model, wherein the final geospatial model, utilizes a geospatial data set comprising one or more of the first data set, the features, the final second data set, and the design parameters, and wherein the final geospatial model substantially isolates one or more of the design parameters, including a location of the well and stimulation of the well, and the final predictive model, utilizes a predictive data set comprising one or more of the first data set, the features, the final second data set, and the design parameters, and (6) designing a final hydraulic fracturing HF job plan, utilizing the final geospatial model and the final predictive model.

C. A system to design a final hydraulic fracturing (HF) job plan for directing operations of well site equipment for a well, including: (1) a data analyzer, operable to generate cleaned data sets by analyzing, cleaning, correcting, and removing outlying data elements from each of received data sets, (2) a feature selector, operable to identify features utilizing a received job plan objective wherein the features affect the job plan objective, and wherein the features are identified in the cleaned data sets, (3) a modeler, operable to build geospatial models and predictive models utilizing the cleaned data sets and the features, and (4) a HF processor, operable to analyze each of the geospatial models and the predictive models, operable to select a final geospatial model and select a final predictive model, and operable to output a designed HF job plan as the final HF job plan.

Each of aspects A, B, and C can have one or more of the following additional elements in combination:

Element 1: wherein the data sources are one or more of publicly available well, reservoir, or treatment data, spatial information, sales data, customer provided data, and previous fracture job data. Element 2: the preparing the first data set further includes imputing data elements, wherein the data elements are missing in the data sources. Element 3: the preparing a first data set further includes processing the first data set to remove outlier data elements. Element 4: wherein the data sources include extracted treatment features extracted from historical or real-time treatment job data. Element 5: the extracted treatment features further includes receiving a first time-series pumping data set. Element 6: the extracted treatment features further includes receiving a second time-series pumping data set. Element 7: identifying a first event set, wherein the first event set comprises event time intervals, utilizing the first time-series pumping data set. Element 8: the extracted treatment features further includes training a machine learning model utilizing the first event set. Element 9: the extracted treatment features further includes estimating a second event set, utilizing the second time-series pumping data set and the machine learning model. Element 10: wherein the first time-series pumping data set comprises one or more of treating pressure, slurry rate, and proppant concentration, and wherein the second time-series pumping data set comprises one or more of treating pressure, slurry rate, and proppant concentration. Element 11: wherein the engineering features represent one or more standard features, logic features, physics features, or smart features. Element 12: engineering features further include aggregating one or more of treatment level features and pumping stage level features to define features representing well production over a determined time period. Element 13: wherein the processing the final second data set further includes cleaning the preliminary second data set utilizing statistical techniques. Element 14: wherein the processing the final second data set further includes verifying the preliminary second data set utilizing statistical quality check techniques. Element 15: wherein the processing the final second data set further includes applying a smoothing technique to the preliminary second data set to generate a smoothed second data set, to realize one or more of reducing statistical noise, correcting erroneous data, and identifying unusable production well data. Element 16: wherein the processing the final second data set further includes computing the KPI utilizing the smoothed second data set, wherein the KPI is computed from a well production time interval. Element 17: wherein the processing the final second data set further includes generating the final second data set utilizing the smoothed second data set and the KPI. Element 18: wherein the KPI is computed from one of a 30-day, 90-day, 180-day, 365-day, maximum initial production, or estimated ultimate recovery. Element 19: wherein the selecting design parameters further includes identifying the design parameters utilizing one or more of forward step-wise selection, backward step-wise selection, correlation analysis, lasso regression, ridge regression, elastic net regression, and subject matter expert knowledge. Element 20: wherein the selecting design parameters further includes removing design parameters from the final second data set and the features where the design parameters are associated with non-relevant features of the well. Element 21: wherein the building the model for the final geospatial model further includes splitting an aggregate of the geospatial data set into a training data set, a validation data set, and a test data set. Element 22: wherein the building the model for the final geospatial model further includes building one or more preliminary geospatial models utilizing the training data set. Element 23: wherein the building the model for the final geospatial model further includes evaluating each of the preliminary geospatial models utilizing the validation data set. Element 24: wherein the building the model for the final geospatial model further includes analyzing each of the preliminary geospatial models utilizing the test data set. Element 25: wherein the building the model for the final geospatial model further includes comparing each of the preliminary geospatial models utilizing results from the evaluating and the analyzing. Element 26: wherein the building the model for the final geospatial model further includes selecting the final geospatial model from the preliminary geospatial models utilizing the comparing, wherein the final geospatial model results in a higher predictive accuracy compared to other of the preliminary geospatial models. Element 27: wherein the building the model for the final predictive model further includes splitting an aggregate of the predictive data set into a training data set, a validation data set, and a test data set. Element 28: wherein the building the model for the final predictive model further includes building one or more preliminary predictive models utilizing the training data set. Element 29: wherein the building the model for the final predictive model further includes evaluating each of the preliminary predictive models utilizing the validation data set, wherein the evaluating utilizes a cross-validation technique. Element 30: wherein the building the model for the final predictive model further includes analyzing each of the preliminary predictive models utilizing the test data set. Element 31: wherein the building the model for the final predictive model further includes comparing each of the preliminary predictive models utilizing results from the evaluating and the analyzing. Element 32: wherein the building the model for the final predictive model further includes selecting the final predictive model from the preliminary predictive models, wherein the final predictive model results in a higher predictive accuracy, or best fitted to the predictive data set, compared to other of the preliminary predictive models, wherein the final predictive model is utilized to generate predictions for production for the well. Element 33: wherein the designing the final HF job plan further includes determining an operation plan objective. Element 34: wherein the designing the final HF job plan further includes selecting an operation plan feature set utilizing the geospatial data set and the predictive data set. Element 35: wherein the designing the final HF job plan further includes applying constraints to the operation plan feature set, wherein each of the constraints is pre-defined or defined by the operation plan objective. Element 36: wherein the designing the final HF job plan further includes generating one or more preliminary HF job plans, utilizing an optimization algorithm and the final geospatial model, the final predictive model, the operation plan feature set, and the constraints. Element 37: wherein the designing the final HF job plan further includes identifying a final HF job plan from the preliminary HF job plans. Element 38: further comprising evaluating one or more preliminary HF job plans, wherein the evaluating utilizes the operation plan objective, operational feasibility factors, and economic factors. Element 39: wherein the generating utilizes user supplied data ranges and constraints. Element 40: wherein the constraints are one or more of operational feasibility, cost factors, environmental factors, legal factors, and equipment factors. Element 41: wherein the building a model utilizes an ensemble model utilizing a single stage predictive model or a multiple stage predictive model. Element 42: wherein the ensemble model consolidates one or more modeling techniques and data sources. Element 43: wherein the modeling techniques are one or more of physics-based methods, numerical estimation methods, mathematical methods, statistical methods, earth models, geospatial models, geological models, reservoir models, and data-driven machine learning models. Element 44: wherein the data sources are one or more of geospatial location, completion parameters, stimulation parameters, reservoir data, well logs, well directional surveys, drilling parameters, production data, fracture topology, fluid flow and dynamics, distributed acoustic sensing, distributed temperature sensing, well header data, customer data, operator data, and service company data. Element 45: a receiver, operable to receive the received data sets. Element 46: a communicator, operable to transmit the final geospatial model, the final predictive model, and the HF job plan. Element 47: a storage medium, operable to store the received data sets, the features, the geospatial models, the predictive models, and the HF job plan. Element 48: a well controller, operable to receive the geospatial models, the predictive models, and the HF job plan, and to execute the HF job plan. Element 49: wherein the received data sets comprise public, confidential, proprietary, well site location, and historical data sources.

What is claimed is:

1. A method of implementing a final hydraulic fracturing (HF) job plan for directing operations of well site equipment at a well site, comprising:
preparing a first data set, wherein the first data set is statistically processed, and wherein the first data set is processed to join disparate data elements sourced from different data sources;
engineering features utilizing the first data set, wherein engineering the features comprises identifying standard and engineered features;
processing a final second data set, wherein the final second data set is computed from a preliminary second data set comprising estimated production values and reporting issues of well production;
selecting design parameters from the final second data set and the features, wherein the design parameters represent a reduction of a number of the features;
generating preliminary HF models using a final geospatial model and a final predictive model, wherein the final geospatial model utilizes a geospatial data set comprising one or more of the first data set, the features, the final second data set, and the design parameters, and wherein the final geospatial model substantially isolates one or more of the design parameters, including a location of the well and stimulation of the well, and the final predictive model utilizes a predictive data set comprising one or more of the first data set, the features, the final second data set, and the design parameters, wherein the generating includes optimizing the preliminary HF models according to different key performance indicators (KPIs);
selecting, based on satisfying a desired one of the KPIs, a final HF job plan from the preliminary HF job plans; and
executing a HF operation at the well site by controlling the well site equipment according to the final HF job plan.

2. The method as recited in claim 1, wherein the data sources are one or more of publicly available well, reservoir, or treatment data, spatial information, sales data, customer provided data, and previous fracture job data, and the preparing the first data set further comprises:
receiving data elements, wherein the data elements are missing in the data sources; and
processing the first data set to remove outlier data elements.

3. The method of claim 1, wherein the data sources include extracted treatment features extracted from historical or real-time treatment job data, and extracting the extracted treatment features comprises:
receiving a first time-series pumping data set;
receiving a second time-series pumping data set;
identifying a first event set, wherein the first event set comprises event time intervals, utilizing the first time-series pumping data set;
training a machine learning model utilizing the first event set; and
estimating a second event set, utilizing the second time-series pumping data set and the machine learning model.

4. The method as recited in claim 3, wherein the first time-series pumping data set comprises one or more of treating pressure, slurry rate, and proppant concentration, and wherein the second time-series pumping data set comprises one or more of treating pressure, slurry rate, and proppant concentration.

5. The method as recited in claim 1, wherein the engineered features represent one or more standard features, logic features, physics features, or smart features;
and engineering the features further comprises:
aggregating one or more of treatment level features and pumping stage level features to define features representing well production over a determined time period.

6. The method as recited in claim 1, wherein the processing the final second data set further comprises:
cleaning the preliminary second data set utilizing statistical techniques;
verifying the preliminary second data set utilizing statistical quality check techniques;
applying a smoothing technique to the preliminary second data set to generate a smoothed second data set, to realize one or more of reducing statistical noise, correcting erroneous data, and identifying unusable production well data;
computing a KPI utilizing the smoothed second data set, wherein the KPI is computed from a well production time interval; and
generating the final second data set utilizing the smoothed second data set and the KPI.

7. The method as recited in claim 6, wherein the KPI is computed from one of a 30-day, 90-day, 180-day, 365-day, maximum initial production, or estimated ultimate recovery.

8. The method as recited in claim 1, wherein the selecting design parameters further comprises:
identifying the design parameters utilizing one or more of forward step-wise selection, backward step-wise selection, correlation analysis, lasso regression, ridge regression, elastic net regression, and subject matter expert knowledge; and removing design parameters from the second data set and the features where the design parameters are associated with non-relevant features of the well.

9. The method as recited in claim 1, wherein building the final geospatial model comprises:
splitting an aggregate of the geospatial data set into a training data set, a validation data set, and a test data set;
building multiple preliminary geospatial models utilizing the training data set;
evaluating each of the preliminary geospatial models utilizing the validation data set;
analyzing each of the preliminary geospatial models utilizing the test data set;
comparing each of the preliminary geospatial models utilizing results from the evaluating and the analyzing; and
selecting the final geospatial model from the preliminary geospatial models utilizing the comparing, wherein the final geospatial model results in a higher predictive accuracy compared to other of the preliminary geospatial models.

10. The method as recited in claim 1, wherein building the final predictive model further comprises:
splitting an aggregate of the predictive data set into a training data set, a validation data set, and a test data set;
building multiple preliminary predictive models utilizing the training data set;
evaluating each of the preliminary predictive models utilizing the validation data set, wherein the evaluating utilizes a cross-validation technique;
analyzing each of the preliminary predictive models utilizing the test data set;
comparing each of the preliminary predictive models utilizing results from the evaluating and the analyzing; and
selecting the final predictive model from the preliminary predictive models, wherein the final predictive model results in a higher predictive accuracy, or best fitted to the predictive data set, compared to other of the preliminary predictive models, wherein the final predictive model is utilized to generate predictions for production for the well.

11. The method as recited in claim 1, further comprising:
selecting an operation plan feature set utilizing the geospatial data set and the predictive data set; and
applying constraints to the operation plan feature set, wherein
generating the preliminary HF job plans further utilizes, the operation plan feature set, and the constraints.

12. The method as recited in claim 11, further comprising:
evaluating the preliminary HF job plans, wherein the evaluating utilizes the operation plan objective, operational feasibility factors, and economic factors, wherein selecting the final HF job plan is based on the evaluating.

13. The method as recited in claim 11, wherein generating utilizes user supplied data ranges and constraints.

14. The method as recited in claim 11, wherein the constraints are one or more of operational feasibility, cost factors, environmental factors, legal factors, and equipment factors.

15. The method as recited in claim 1, wherein generating the preliminary HF models utilizes an ensemble model utilizing a single stage predictive model or a multiple stage predictive model, and wherein the ensemble model consolidates one or more modeling techniques and data sources.

16. The method as recited in claim 15, wherein the modeling techniques are one or more of physics-based methods, numerical estimation methods, mathematical methods, statistical methods, earth models, geospatial models, geological models, reservoir models, and data-driven machine learning models.

17. The method as recited in claim 15, wherein the data sources are one or more of geospatial location, completion parameters, stimulation parameters, reservoir data, well logs, well directional surveys, drilling parameters, production data, fracture topology, fluid flow and dynamics, distributed acoustic sensing, distributed temperature sensing, well header data, customer data, operator data, and service company data.

18. A computer program product having a series of operating instructions stored on a non-transitory computer-readable medium that directs a data processing apparatus when executed thereby to perform operations to implement a hydraulic fracturing (HF) job plan to direct operations of well site equipment at a well site, having operations comprising:
preparing a first data set, wherein the first data set is statistically processed, and wherein the first data set is processed to join disparate data elements sourced from different data sources;
engineering features utilizing the first data set, wherein engineering the features comprises identifying standard and engineered features;
processing a final second data set, wherein the final second data set is computed from a preliminary second data set comprising estimated production values and reporting issues of a production well;
selecting design parameters from the final second data set and the features, wherein the design parameters represent a reduction of a number of the features;
generating preliminary HF models using a final geospatial model and a final predictive model, wherein the final geospatial model utilizes a geospatial data set comprising one or more of the first data set, the features, the final second data set, and the design parameters, and wherein the final geospatial model substantially isolates one or more of the design parameters, including a location of the well and stimulation of the well, and the final predictive model, utilizes a predictive data set comprising one or more of the first data set, the features, the final second data set, and the design parameters, wherein the generating includes optimizing the preliminary HF models according to different key performance indicators (KPIs);
selecting, based on satisfying a desired one of the KPIs, a final HF job plan from the preliminary HF job plans; and
executing a HF operation at the well site by controlling the well site equipment according to the final HF job plan.

19. The computer program product as recited in claim 18, wherein the processing the final second data set further comprises:
cleaning the preliminary second data set utilizing statistical techniques;
verifying the preliminary second data set utilizing statistical quality check techniques;

applying a smoothing technique to the preliminary second data set to generate a smoothed second data set, to realize one or more of reducing statistical noise, correcting erroneous data, and identifying unusable production well data;

computing a KPI utilizing the smoothed second data set, wherein the KPI is computed from a well production time interval; and generating the final second data set utilizing the smoothed second data set and the KPI.

20. The computer program product as recited in claim 18, operations further comprising:

identifying the design parameters utilizing one or more of forward step-wise selection, backward step-wise selection, correlation analysis, lasso regression, ridge regression, elastic net regression, and subject matter expert knowledge; and removing design parameters from the final second data set and the features where the design parameters are associated with non-relevant features of the well, wherein building the final geospatial model comprises:

splitting an aggregate of the geospatial data set into a training data set, a validation data set, and a test data set;

building multiple preliminary geospatial models utilizing the training data set;

evaluating each of the preliminary geospatial models utilizing the validation data set;

analyzing each of the preliminary geospatial models utilizing the test data set;

comparing each of the preliminary geospatial models utilizing results from the evaluating and the analyzing; and selecting the final geospatial model from the preliminary geospatial models utilizing the comparing, wherein the final geospatial model results in a higher predictive accuracy compared to other of the preliminary geospatial models.

21. The computer program product as recited in claim 18, wherein building the final predictive model comprises:

splitting an aggregate of the predictive data set into a training data set, a validation data set, and a test data set;

building multiple preliminary predictive models utilizing the training data set;

evaluating each of the preliminary predictive models utilizing the validation data set, wherein the evaluating utilizes a cross-validation technique;

analyzing each of the preliminary predictive models utilizing the test data set;

comparing each of the preliminary predictive models utilizing results from the evaluating and the analyzing; and selecting the final predictive model from the preliminary predictive models, wherein the final predictive model results in a higher predictive accuracy, or best fitted to the predictive data set, compared to other of the preliminary predictive models, wherein the final predictive model is utilized to generate predictions for production for the well.

22. A system to implement a final hydraulic fracturing (HF) job plan for directing operations of well site equipment at a well site, comprising one or more processors to perform operations that include:

generating cleaned data sets by analyzing, cleaning, correcting, and removing outlying data elements from each of received data sets;

identifying features utilizing a received job plan objective wherein the features affect the job plan objective, and wherein the features are identified in the cleaned data sets;

building geospatial models and predictive models utilizing the cleaned data sets and the features; and analyzing each of the geospatial models and the predictive models, selecting a final geospatial model and a final predictive model, generating preliminary HF models utilizing the final geospatial model and the final predictive model, wherein the generating includes optimizing the preliminary HF models according to different key performance indicators (KPIs), selecting, based on satisfying a desired one of the KPIs a final HF job plan from the preliminary job plans, and executing a HF operation at the well site by controlling the well site equipment according to the final HF job plan.

23. The system as recited in claim 22, further comprising:
a receiver, operable to receive the received data sets;
a communicator, operable to transmit the final geospatial model, the final predictive model, and the final HF job plan; and
a storage medium, operable to store the received data sets, the features, the geospatial models, the predictive models, and the final HF job plan.

24. The system as recited in claim 22, wherein the received data sets comprise public, confidential, proprietary, well site location, and historical data sources.

* * * * *